United States Patent
Chinya et al.

(10) Patent No.: US 11,804,851 B2
(45) Date of Patent: Oct. 31, 2023

(54) METHODS, SYSTEMS, ARTICLES OF MANUFACTURE, AND APPARATUS TO DECODE ZERO-VALUE-COMPRESSION DATA VECTORS

(71) Applicant: Intel Corporation, Santa Clara, CA (US)

(72) Inventors: Gautham Chinya, Sunnyvale, CA (US); Debabrata Mohapatra, Santa Clara, CA (US); Arnab Raha, Santa Clara, CA (US); Huichu Liu, Santa Clara, CA (US); Cormac Brick, San Francisco, CA (US)

(73) Assignee: INTEL CORPORATION, Santa Clara, CA (US)

( * ) Notice: Subject to any disclaimer, the term of this patent is extended or adjusted under 35 U.S.C. 154(b) by 703 days.

(21) Appl. No.: 16/832,804

(22) Filed: Mar. 27, 2020

(65) Prior Publication Data
US 2020/0228137 A1    Jul. 16, 2020

(51) Int. Cl.
*H03M 7/30*       (2006.01)
*G06F 16/22*      (2019.01)
(Continued)

(52) U.S. Cl.
CPC ...... *H03M 7/3082* (2013.01); *G06F 16/2237* (2019.01); *G06N 3/063* (2013.01); *G06N 3/04* (2013.01); *G06N 3/08* (2013.01)

(58) Field of Classification Search
CPC ............. H03M 7/3082; H03M 7/3059; H03M 7/3066; G06F 16/2237; G06F 17/153;
(Continued)

(56) References Cited

U.S. PATENT DOCUMENTS

| 6,259,456 B1 * | 7/2001 | Gibson | G06F 9/3879 |
| | | | 712/E9.067 |
| 6,311,258 B1 * | 10/2001 | Gibson | G06F 9/3879 |
| | | | 711/212 |

(Continued)

OTHER PUBLICATIONS

European Patent Office: "Extended European Search Report," issued in corresponding European Patent Application No. 20211834.5-1231 dated Jun. 1, 2021, (9 pages).

(Continued)

*Primary Examiner* — Jean B Jeanglaude
(74) *Attorney, Agent, or Firm* — Akona IP

(57) ABSTRACT

Methods, systems, articles of manufacture, and apparatus are disclosed to decode zero-value-compression data vectors. An example apparatus includes: a buffer monitor to monitor a buffer for a header including a value indicative of compressed data; a data controller to, when the buffer includes compressed data, determine a first value of a sparse select signal based on (1) a select signal and (2) a first position in a sparsity bitmap, the first value of the sparse select signal corresponding to a processing element that is to process a portion of the compressed data; and a write controller to, when the buffer includes compressed data, determine a second value of a write enable signal based on (1) the select signal and (2) a second position in the sparsity bitmap, the second value of the write enable signal corresponding to the processing element that is to process the portion of the compressed data.

21 Claims, 13 Drawing Sheets

(51) Int. Cl.
  *G06N 3/063* (2023.01)
  *G06N 3/08* (2023.01)
  *G06N 3/04* (2023.01)

(58) Field of Classification Search
  CPC .......... G06F 17/16; G06N 3/063; G06N 3/04;
  G06N 3/08
  USPC .......................................................... 341/87
  See application file for complete search history.

(56) References Cited

U.S. PATENT DOCUMENTS

| | | | | |
|---|---|---|---|---|
| 6,707,463 | B1* | 3/2004 | Gibson | G06F 9/3879 |
| | | | | 712/E9.067 |
| 11,586,601 | B2* | 2/2023 | Xiao | G06N 3/063 |
| 2012/0053948 | A1* | 3/2012 | Mustiere | H03M 7/30 |
| | | | | 341/87 |
| 2016/0212245 | A1* | 7/2016 | Shoaib | H04L 69/04 |
| 2020/0228137 | A1 | 7/2020 | Chinya et al. | |

OTHER PUBLICATIONS

Gupta et al.: "MASR: A Modular Accelerator for Sparse RNNs," 2019 28th International Conference on Parallel Architectures and Compilation Techniques (PACT), IEEE Computer Society, Sep. 23, 2019, 14 pages.

Parashar et al.: "SCNN: An Accelerator for Compressed-sparse Convolutional Neural Networks," Proceedings of the 44th Annual International Symposium on Computer Architecture, ISCA '17, ACM Press, New York, New York, Jun. 24, 2017, 14 pages.

Yu et al.: "SPRING: A Sparsity-Aware Reduced-Precision Monolithic 3D CNN Accelerator Architecture for Training and Inference," IEEE, Feb. 3, 2020, 14 pages.

Aimar et al.: "NullHop: A Flexible Convolutional Neural Network Accelerator Based on Sparse Representations of Feature Maps," Cornell University Library, 201 Olin Library Cornell University, Ithaca, New York, Mar. 6, 2018, 13 pages.

V. Sze, Y. Chen, T. Yang and J. S. Emer, "Efficient Processing of Deep Neural Networks: A Tutorial and Survey," in Proceedings of the IEEE, arXiv:1703.09039v2 [cs.CV] Aug. 13, 2017 (32 pages).

M. Rhu, M. O'Connor, N. Chatterjee, J. Pool, Y. Kwon and S. W. Keckler, "Compressing DMA Engine: Leveraging Activation Sparsity for Training Deep Neural Networks," 2018 IEEE International Symposium on High Performance Computer Architecture (HPCA), Vienna, 2018, pp. 78-91 (14 pages).

Intel, "Intel® Movidius™ Myriad™ VPU 2: A Class-Defining Processor," available online: https://www.movidius.com/myriad2, last retrieved Mar. 27, 2020 (4 pages).

Chinya, "Schedule-Aware Tensor Distribution Module," U.S. Appl. No. 16/456,707, filed Jun. 28, 2019 (49 pages).

* cited by examiner

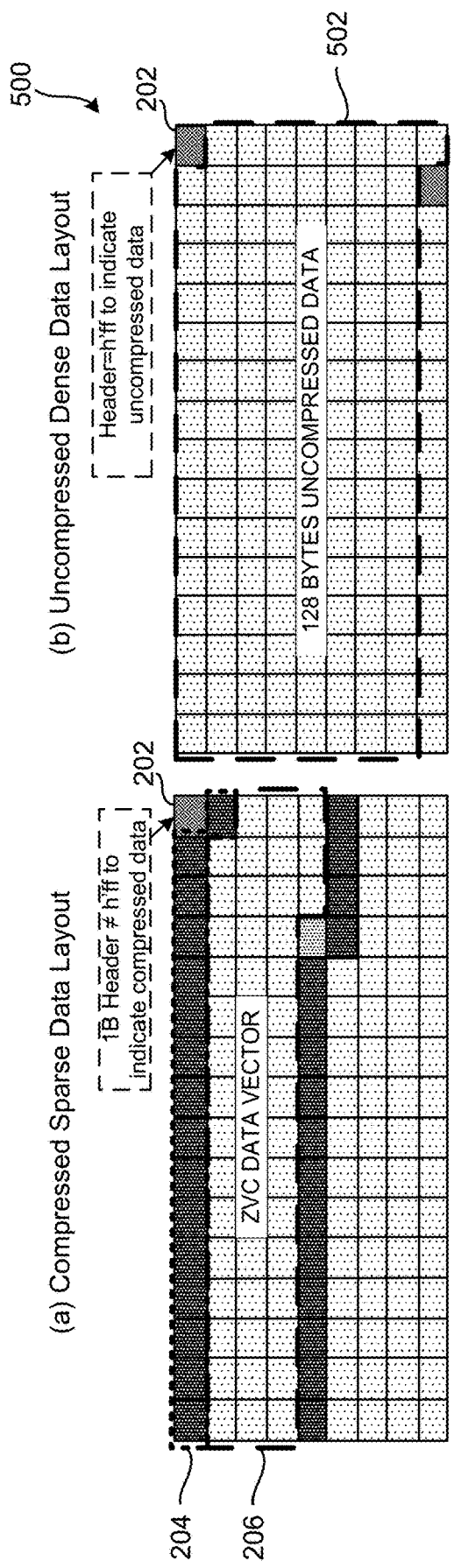

METHODS, SYSTEMS, ARTICLES OF MANUFACTURE, AND APPARATUS TO DECODE ZERO-VALUE-COMPRESSION DATA VECTORS

FIELD OF THE DISCLOSURE

This disclosure relates generally to processors, and, more particularly, to methods, systems, articles of manufacture, and apparatus to decode zero-value-compression data vectors.

BACKGROUND

Mobile devices typically include image processing, video processing, and speech processing capabilities that are limited by size constraints, temperature management constraints, and/or power constraints. In some examples, neural network applications, other machine learning and/or artificial intelligence applications use such image processing, video processing, and speech processing. Such neural network applications, other machine learning and/or artificial intelligence applications may store data in two-dimensional vectors (e.g., maps, channels, etc.). In some examples, the two-dimensional vectors may be grouped to produce a multi-dimensional (e.g., three-dimensional, four-dimensional, etc.) volume/array, referred to as a tensor. Tensors, and other multi-dimensional data structures, are typically stored in memory at addresses according to a particular order (e.g., corresponding to the dimensions of the multi-dimensional data structures).

BRIEF DESCRIPTION OF THE DRAWINGS

FIG. 4 is a graphical illustration of an example mapping of zero-value-compression of sparse data in the first input buffer of FIGS. 1 and 2.

FIG. 5 is a graphical illustration of an example mapping of uncompressed dense data in the first input buffer of FIGS. 1 and 2.

FIG. 9 is a graphical illustration showing example communication schemes of uncompressed dense data in accordance with the teachings of this disclosure.

FIG. 10 is a graphical illustration showing example communication schemes of zero-value-compression of sparse data in accordance with the teachings of this disclosure.

Figure 1:
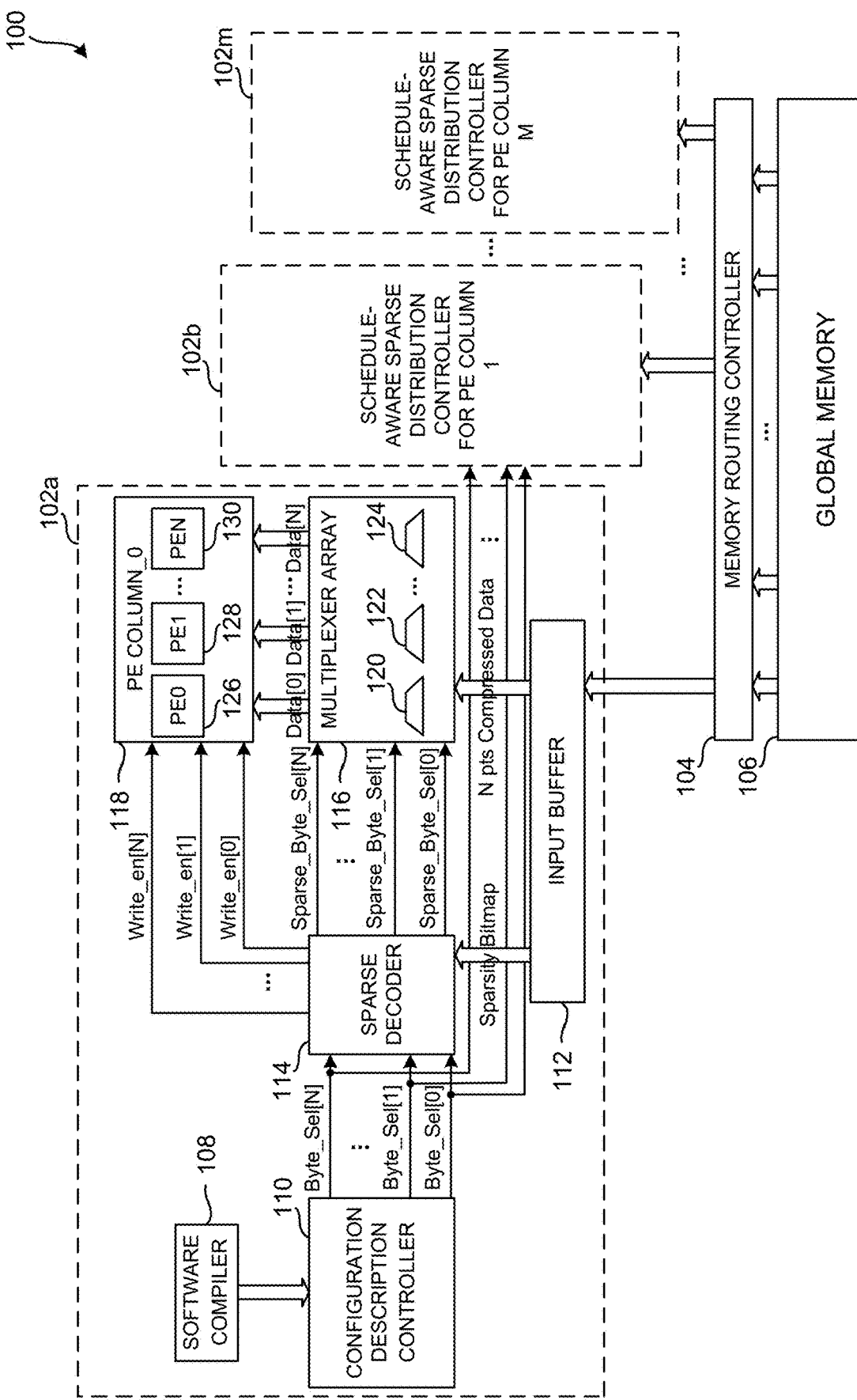
FIG. 1 is a block diagram of an example in-line sparsity-aware tensor data distribution system constructed in accordance with the teachings of this disclosure.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Typical computing systems, including personal computers and/or mobile devices, employ advanced image processing, computer vision, video processing, and/or speech processing algorithms to automate tasks that human vison and/or human hearing can perform. Computer vision, image processing, and/or video processing tasks include acquiring, processing, analyzing, and/or otherwise understanding digital images. Such tasks facilitate, in part, extraction of dimensional data from the digital images to produce numerical and/or symbolic information. Computer vision algorithms can use the numerical and/or symbolic information to make decisions and/or otherwise perform operations associated with three-dimensional (3-D) pose estimation, event detection, object recognition, video tracking, among others. To support augmented reality (AR), virtual reality (VR), robotics and/or other applications, it is then accordingly important to perform such tasks quickly (e.g., in real time or near real time) and efficiently.

Advanced image processing and/or computer vision algorithms sometimes employ a deep neural network (DNN). A DNN is an artificial neural network including multiple layers. For example, DNNs can include any number of hidden layers, usually more than one. DNNs are typically used to classify images, cluster the images by similarity (e.g., a photo search), and/or perform object recognition within the images. In some examples, image processing or computer vision algorithms employ convolutional neural networks (CNNs). A DNN and/or a CNN can be used to identify faces, individuals, street signs, animals, etc., included in an input image.

DNNs and/or CNNs obtain vectors (e.g., image data that is broken down from multi-dimensional arrays) that need to be stored or used in computations to perform one or more functions. Thus, a DNN and/or a CNN may receive multi-dimensional arrays (e.g., tensors or rows of vectors) including data corresponding to one or more images. The multi-dimensional arrays are represented as vectors. Such vectors may include thousands of elements. Each such element may include a large number of bits. A vector with 10,000 16 bit elements corresponds to 160,000 bits of information. Storing such vectors requires significant memory. However, such vectors may include large numbers of elements with a value of zero. Accordingly, some DNNs, some CNNs and/or other processing engines may break up such a vector into a zero-value-compression (ZVC) data vector and a sparsity bitmap (e.g., a bitmap vector).

As defined herein, a zero-value-compression (ZVC) data vector is a vector that includes all non-zero elements of a vector in the same order as a sparse vector, but excludes all zero elements. As defined herein, a sparse vector is an input vector including both non-zero elements and zero elements. As defined herein, a dense vector is an input vector including all non-zero elements. As such, an example sparse vector [0, 0, 5, 0, 18, 0, 4, 0] corresponds to an example ZVC data vector [5, 18, 4]. As defined herein, a sparsity bitmap is a vector that includes one-bit elements identifying whether respective elements of the sparse vector are zero or non-zero. Thus, a sparsity bitmap may map non-zero values of a sparse vector to '1' and may map zero values of the sparse vector to '0'. For the above example sparse vector of [0, 0, 5, 0, 18, 0, 4, 0], an example sparsity bitmap may be [0, 0, 1, 0, 1, 0, 1, 0] (e.g., because the third, fifth, seventh, and eight elements of the sparse vector are non-zero). The combination of the ZVC data vector and the sparsity bitmap represents the sparse vector (e.g., the sparse vector could be generated/reconstructed based on the corresponding ZVC data vector and sparsity bitmap). Accordingly, a DNN and/or a CNN engine can generate/determine the sparse vector based on the corresponding ZVC data vector and sparsity bitmap without storing the sparse vector in memory.

Storing a ZVC data vector and a sparsity bitmap in memory instead of a sparse vector saves memory and processing resources (e.g., provided there are sufficient zeros in the sparse vector(s)). For example, if each element of the above-sparse vector (e.g., [0, 0, 5, 0, 18, 0, 4, 0]) was 16 bits of information, the amount of memory required to store the sparse vector is 128 bits (e.g., 8 elements×16 bits). However, the amount of memory required to store the corresponding ZVC data vector (e.g., [5, 18, 4]) and the sparsity bitmap (e.g., 0, 0, 1, 0, 1, 0, 1, 0]) is 64 bits (e.g., (the 3 elements of the ZVC data vector×16 bits)+(8 elements of the sparsity bitmap×1 bit)). Accordingly, storing the ZVC data vector and sparsity bitmap instead of a corresponding sparse vector reduces the amount of memory needed to store such vectors. Additionally, utilizing ZVC data vectors and sparsity bitmaps improves bandwidth requirements because the amount of data being delivered into a computational engine is decreased to increase the delivery speed to the computational engine.

Machine learning accelerators (e.g., those utilizing DNN engines, CNN engines, etc.) handle a large amount of tensor data (e.g., data stored in multi-dimensional data structures) for performing inference tasks. Processing large amounts of tensor data requires data movement across multiple levels of a memory hierarchy (e.g., hard drives, flash storage, RAM, cache, registers, etc.) to a processing element (PE) array. Reducing data transfer and increasing (e.g., maximizing) data reuse and resource utilization can improve energy efficiency. Due to the nature of DNN and/or other AI engines, both inputs to the DNN (sometimes referred to as input activations and/or input feature maps) and weights (sometimes referred to as trained DNN model parameters) include sparse vectors. For example, input activation vectors and/or weight vectors can include a significant amount of zero elements due to rectifying operations in DNN layers. As illustrated above, utilizing ZVC data vectors and sparsity bitmaps can be an effective technique to accelerate the inference and training of a DNN as well as to reduce the storage requirement for parameters (e.g. compression) for energy efficiency.

Common DNN accelerators are built from a spatial array of PEs and local storage such as register files (RF) and static random access memory (SRAM) banks. For inference tasks, the weights or filters are pre-trained and layer-specific. As such, the weights and/or filters need to be loaded to PE arrays from the storage (e.g. dynamic random access memory (DRAM) and/or SRAM buffers). Input images, sometimes referred to as input activations or input feature maps, are also loaded into PE arrays, where PEs execute multiply accumulate (MAC) operations via one or more input channels (Ic) and generate output activations. One or more sets of weight tensors (Oc) are often used for a given set of input activations to produce an output tensor volume. A non-linear function (e.g. rectified linear unit (ReLu)), is applied to the output activations which become the input activations for the next layer. In some DNNs, a significant fraction of each DNN layer's activations and weights are zero-valued due to ReLu operations, hence this data can be compressed via various techniques to save the on-chip storage requirements and bandwidth demands.

Some chip designers require relatively large area and energy overhead when storing tensor data is in a compressed format (e.g., a ZVC data vector) in on-chip memory (e.g. global buffers or lane buffers). For example, some compressed direct memory access (cDMA) implementations on graphics processing units (GPUs) require additional on-chip memory and/or storage to hold decompressed data before distribution to a PE array. For accelerators, some chip designers use dedicated storage to hold sparsity bitmaps or prefixes to decode and deliver the tensor data to a PE array with a fixed schedule. As defined herein, a fixed schedule includes a schedule which only allows one or two fixed tensor shapes and volume to be distributed to a PE array. Additionally, as defined herein, when utilizing fixed schedules each PE in a PE array can only process fixed tensor shapes for all DNNs and/or AI engines. The fixed data processing decreases the energy efficiency due to limited reusability of the data in the PE array and increases the memory access and data movement.

Examples disclosed herein include methods, systems, articles of manufacture, and apparatus to decode zero-value-compression data vectors (e.g., in machine learning accelerators). Examples disclosed herein include an in-line sparsity-aware tensor distribution system to enable flexible tensor data processing (e.g., in machine learning accelerators). While examples disclosed herein are discussed in connection with machine learning accelerators, such examples are not limited thereto. Disclosed methods, systems, articles of manufacture, and apparatus include an in-line sparsity-aware tensor data distribution system, which can be applied for in-line zero-value-compression sparsity encoding and/or decoding schemes. Examples disclosed herein support flexible tensor data processing for machine learning accelerators without storing uncompressed data through the on-chip memory hierarchy (e.g. global buffers, load buffers, register files in PEs).

Examples disclosed herein include an in-line sparsity-aware tensor data distribution system that decompresses ZVC data vectors for both activations and weights and distribute to a PE array. The in-line sparsity-aware tensor data distribution system disclosed herein maintains data in compressed data format in each PE based on a programmable schedule (e.g., a mapping between instructions (e.g., a program, an algorithm, etc.) to selected processing elements). Example disclosed in-line sparsity-aware tensor data distribution systems reconstruct the sparsity bitmap per tensor on the fly in PEs. Examples disclosed herein store compressed data (e.g., ZVC data vectors) with sparsity bitmaps through memory hierarchies from global buffers (e.g., SRAM banks) to register files in PEs without storing zero-elements. Thus, examples disclosed herein reduce data movement and improve energy efficiency of a computing device. The flexible tensor distribution is controlled, at least in part, by configuration descriptors, that are not dependent on the sparsity of input data but are exposed to the compiler to be configured during runtime.

Examples disclosed herein advantageously increase local register file utilization and decrease data movement energy expenditure by storing non-zero elements as opposed to zero elements and non-zero elements. Examples disclosed herein advantageously reconstruct the sparsity bitmap at PEs on the fly according to the flexible tensor shapes. Examples disclosed herein advantageously do not require staging buffers for uncompressed data (e.g., sparse vectors). For instance, examples disclosed herein do not require movement of zero elements through an on-chip memory hierarchy. Examples disclosed herein advantageously provide programmable and flexible tensor data distribution capability to support different schedules in terms of convolution loop partitioning and loop blocking (e.g. weight-stationary, activation stationary, partial sum-stationary, etc.).

Examples disclosed herein enable energy efficient DNN accelerators to improve edge inferences for one or more AI applications including imaging, video and speech applications. Examples disclosed herein improve energy efficiency, performance, and advantageously leverage transistor scaling. Examples disclosed herein enable efficient processing of sparse data to deliver improved energy efficiency for modern AI workloads.

FIG. 1 is a block diagram of an example in-line sparsity-aware tensor data distribution (InSAD) system 100. In the example of FIG. 1, the InSAD system 100 includes an example first schedule-aware sparse distribution controller 102*a*, an example second schedule-aware sparse distribution controller 102*b*, an example mth schedule-aware sparse distribution controller 102*m*, an example memory routing controller 104, an example global memory 106, an example software compiler 108, and an example configuration description controller 110. Each of the example first schedule-aware sparse distribution controller 102*a*, the example second schedule-aware sparse distribution controller 102*b*, and the mth schedule-aware sparse distribution controller 102*m* includes any number of components.

For the sake of clarity, the structure and functionality of the example InSAD system 100 will be discussed with respect to the first schedule-aware sparse distribution controller 102*a*. However, the structure and functionality of the example InSAD system 100 is not limited thereto. For example, the number of schedule-aware sparse distribution controllers included in the InSAD system 100 (e.g., the value of m) can correspond to the number of PE columns in a PE array of a platform. For example, if the PE array of a platform includes six PE columns, the InSAD system 100 can include six schedule-aware sparse distribution controllers (e.g., m=6).

In the illustrated example of FIG. 1, the first schedule-aware sparse distribution controller 102*a* is coupled to and/or otherwise in-circuit with the memory routing controller 104 and the configuration description controller 110. The example memory routing controller 104 is coupled to and/or otherwise in-circuit with the first schedule-aware sparse distribution controller 102*a* and the global memory 106. The global memory 106 is coupled to and/or otherwise in-circuit with the memory routing controller 104. The software compiler 108 is coupled to and/or otherwise in-circuit with the configuration description controller 110. The configuration description controller 110 is coupled to and/or otherwise in-circuit with the software compiler 108 and the first schedule-aware sparse distribution controller 102*a*.

In the illustrated example of FIG. 1, the first schedule-aware sparse distribution controller 102*a* includes an example first input buffer 112, an example first sparse decoder 114, an example first multiplexer array 116, and an example first processing element (PE) column 118. The example first multiplexer array 116 includes an example first multiplexer 120, an example second multiplexer 122, and an example nth multiplexer 124. The example first PE column 118 includes an example first PE 126, an example second PE 128, and an example nth PE 130. As previously mentioned, each of the example first schedule-aware sparse distribution controller 102*a*, the example second schedule-aware sparse distribution controller 102*b*, and the mth schedule-aware sparse distribution controller 102*m* includes any number of components. For example, the example components of the first schedule-aware sparse distribution controller 102*a* can be included in any of the example second schedule-aware sparse distribution controller 102*b* and the mth schedule-aware sparse distribution controller 102*m*.

For the sake of clarity, the structure and function of the example first schedule-aware sparse distribution controller 102*a* will be discussed with respect to input activation data. However, the structure and functionality of the example first schedule-aware sparse distribution controller 102*a* is not limited thereto. For example, the first schedule-aware sparse distribution controller 102*a* can include duplicate components for input weight data. An example PE in accordance with such an example is discussed in connection with FIG. 3. In examples disclosed herein the PE array size of the platform including the InSAD system 100 is m×n, where m is the number of PE columns and n is the number of PEs in each PE column.

In the illustrated example of FIG. 1, the software compiler 108 generates a schedule to process data stored in the global memory 106. In examples disclosed herein, the schedule is sparsity independent. In the example of FIG. 1, the software compiler 108 is implemented as a program executing on a processor. In additional or alternative examples, the software compiler 108 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

In the illustrated example of FIG. 1, the memory routing controller 104 controls which data is sent to which schedule-aware sparse distribution controller (e.g., the first schedule-aware sparse distribution controller 102a, the second schedule-aware sparse distribution controller 102b, the mth schedule-aware sparse distribution controller 102m, etc.). In the example of FIG. 1, the memory routing controller 104 can be implemented by multiplexer array selection and/or network on chip (NOC) arbitration logic. In additional or alternative examples, the memory routing controller 104 can be implemented by one or more analog or digital circuit(s), logic circuits, programmable processor(s), programmable controller(s), GPU(s), DSP(s), ASIC(s), PLD(s) and/or FPLD(s).

In the illustrated example of FIG. 1, the global memory 106 stores data on a processing platform (e.g., a mobile device, a laptop computer, a smartphone, a tablet, a workstation, etc.). For example, the global memory 106 can store activation data and/or weight data. Data stored in the global memory 106 can be stored as sparse vectors, dense vectors, ZVC data vectors, and/or sparsity bitmaps. In the example of FIG. 1, the global memory 106 is implemented by SRAM and/or DRAM. In additional or alternative examples, the global memory 106 can be implemented by a volatile memory (e.g., a Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory, read only memory (ROM), programmable ROM (PROM), erasable PROM (EPROM), electrically erasable PROM (EEPROM), etc.). The example global memory 106 may additionally or alternatively be implemented by one or more double data rate (DDR) memories, such as DDR, DDR2, DDR3, DDR4, mobile DDR (mDDR), etc.

In additional or alternative examples, the example global memory 106 can be implemented by one or more mass storage devices such as hard disk drive(s), compact disk drive(s), digital versatile disk drive(s), solid-state disk drive(s), etc. While in the illustrated example the global memory 106 is illustrated as a single database, the global memory 106 may be implemented by any number and/or type(s) of databases. Furthermore, the data stored at the global memory 106 may be in any data format such as, for example, binary data, comma delimited data, tab delimited data, structured query language (SQL) structures, etc. In FIG. 1, the example global memory 106 is an organized collection of data, stored on a computational system that is electronically accessible. For example, the global memory 106 may be stored on a server, a desktop computer, an HDD, an SSD, or any other suitable computing system.

In the illustrated example of FIG. 1, the configuration description controller 110 generates byte select signals (e.g., Byte_Sel[0] through Byte_Sel[N]) based on the schedule generated by the software compiler 108. The byte select signals (e.g., Byte_Sel[0] through Byte_Sel[N]) determine the shape of the tensor (e.g., two by two by three, etc.) to be processed and the volume processed by each PE according to a schedule. The configuration description controller 110 includes configuration descriptors that are dependent on the software programming schedule which is sparsity independent. In examples disclosed herein the configuration descriptors include a set of software programmable schedule dependent configuration descriptors that, when utilized by the configuration description controller 110, produce byte select signals (e.g., Byte_Sel[0]-Byte_Sel[N]) for PEs based on the uncompressed tensor data. As such, the byte select signals (e.g., Byte_Sel[0]-Byte_Sel[N]) are sparsity independent and are applied to the compressed data after being processed by the first sparse decoder 114 to account for changes in byte position caused by ZVC. In the example of FIG. 1, the configuration description controller 110 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In the illustrated example of FIG. 1, the first input buffer 112 is implemented by a circular buffer. In additional or alternative examples, any buffer suitable to an application can implement the first input buffer 112. In the example of FIG. 1, the first input buffer 112 stores data (compressed or uncompressed) to be processed by the first PE column 118. Further detail illustrating the format of data (compressed and uncompressed) stored in the first input buffer 112 is discussed in connection with FIGS. 4 and 5.

In the illustrated example of FIG. 1, the first sparse decoder 114 is a flexible schedule-aware sparse decoder. For example, the first sparse decoder 114 is a flexible schedule-aware sparse decoder because the first sparse decoder 114 decodes data stored in one or more tensor shapes. In examples disclosed herein, the first sparse decoder 114 translates the schedule-dependent byte select signals (e.g., Byte_Sel[0]-Byte_Sel[N]) to sparsity-dependent byte select signals (e.g., Sparse_Byte_Sel[0]-Sparse_Byte_Sel[N]) based on the sparsity bitmap (SB). The example first sparse decoder 114 can then apply the sparsity-dependent byte select signals (e.g., Sparse_Byte_Sel[0]-Sparse_Byte_Sel[N]) to one or more ZVC data vectors. Based on the sparsity bitmap, the example first sparse decoder 114 generates write enable signals (e.g., write_en[0]-write_en[N]) to enable each PE with selected data from the ZVC data vector. In examples disclosed herein, the write enable signals (e.g., write_en[0]-write_en[N]) control which data from the first input buffer 112 that is transferred to each PE. In the example of FIG. 1, the first sparse decoder 114 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In some examples, the example first sparse decoder 114 implements example means for decoding. The decoding means is structure, and is implemented by executable instructions, such as those implemented by at least blocks 1202, 1204, 1206, 1208, 1210, 1212, 1214, 1218, 1224, 1226, 1228, 1230, 1232, 1236, 1238, 1244, 1246, 1248, and 1250 of FIG. 12 and/or at least blocks 1302, 1304, 1306, 1308, and 1310 of FIG. 13. For example, the executable instructions of blocks 1202, 1204, 1206, 1208, 1210, 1212, 1214, 1218, 1224, 1226, 1228, 1230, 1232, 1236, 1238, 1244, 1246, 1248, and 1250 of FIG. 12 and/or blocks 1302, 1304, 1306, 1308, and 1310 of FIG. 13 may be executed on at least one processor such as the example processor 1512 shown in the example of FIG. 15. In other examples, the decoding means is implemented by hardware logic, hardware implemented state machines, logic circuitry, and/or any other combination of hardware, software, and/or firmware.

In the illustrated example of FIG. 1, the first multiplexer array 116 is implemented by the first multiplexer 120, the second multiplexer 122, and the nth multiplexer 124. In the example of FIG. 1, the first multiplexer array 116 is driven by n sparsity-dependent byte-select signals (e.g., Sparse_Byte_Sel[0]-Sparse_Byte_Sel [N]). In examples disclosed herein, the schedule-dependent byte-select signals (e.g., Byte_Sel[0]-Byte_Sel[N]) are the same for all PE columns, but the sparsity-dependent byte-select signals (e.g., Sparse_Byte_Sel[0]-Sparse_Byte_Sel[N]) are different among different PE columns due to the data dependency of the respective ZVC data vectors transmitted to each schedule-aware sparse distribution controller by the memory routing controller 104.

In some examples, the example first multiplexer array 116 implements example means for multiplexing. The multiplexing means is structure, and is implemented by executable instructions, such as those implemented by at least blocks 1216, 1220, 1234 and 1240 of FIG. 12.

Figure 12:
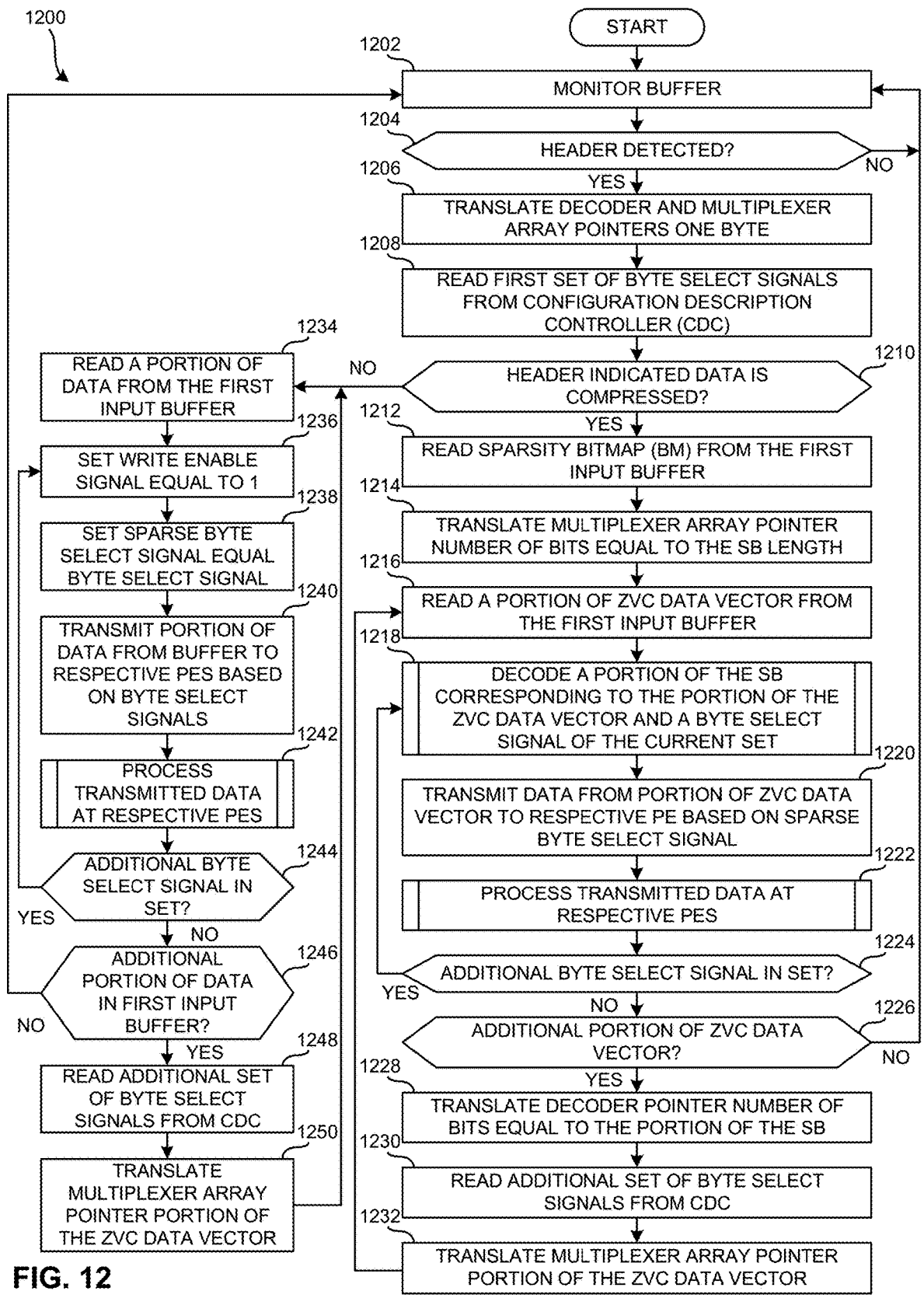
FIG. 12 is a flowchart representative of an example process, which may be implemented utilizing machine-readable instructions that may be executed, to implement the example in-line sparsity-aware tensor data distribution system of FIG. 1.
Figure 15:
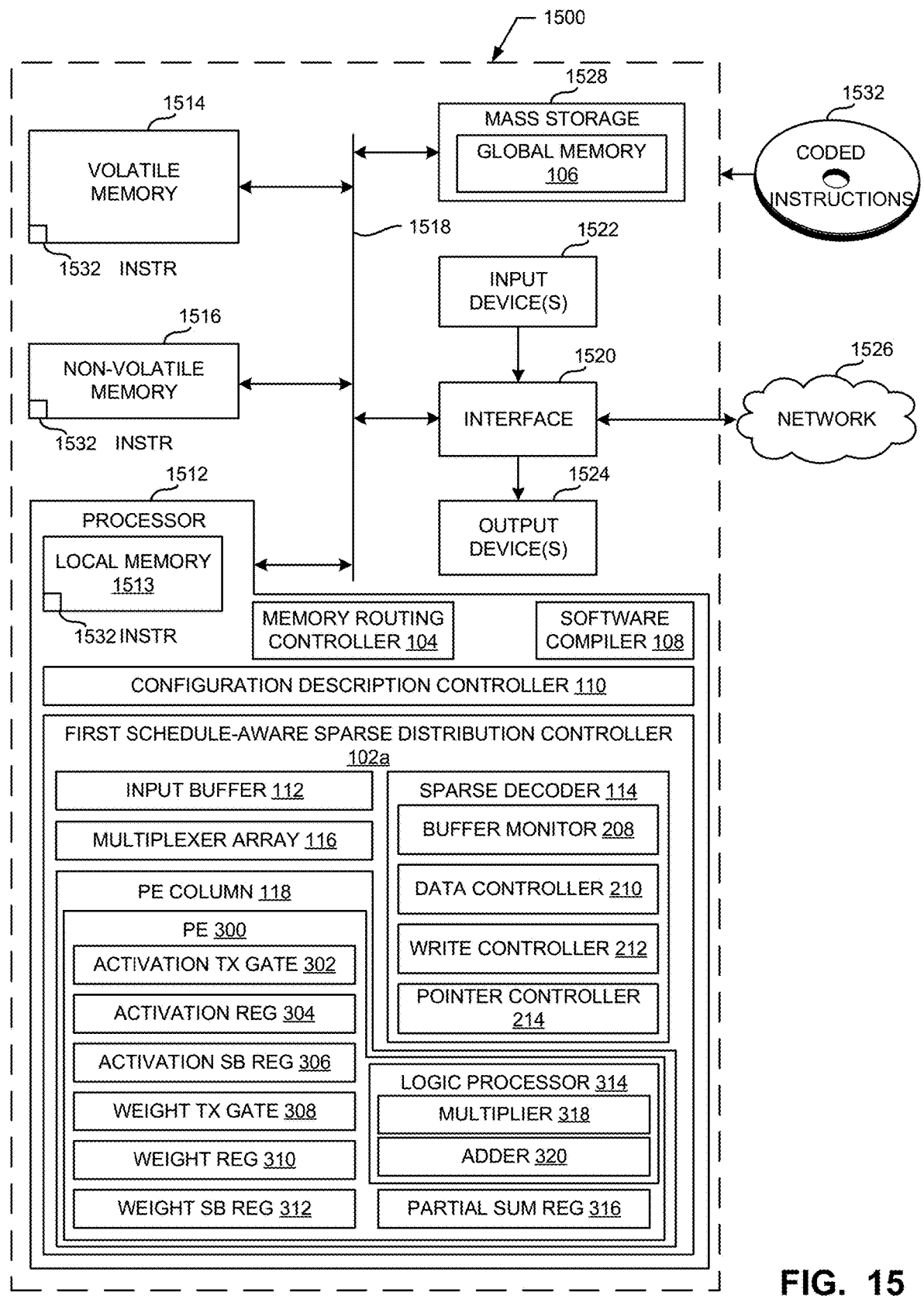
FIG. 15 is a block diagram of an example processor platform structured to execute the instructions of FIGS. 12, 13, and 14 to implement the example in-line sparsity-aware tensor data distribution system of FIG. 1, the first sparse decoder of FIG. 2, and/or the processing element of FIG. 3.

For example, the executable instructions of blocks 1216, 1220, 1234 and 1240 of FIG. 12 may be executed on at least one processor such as the example processor 1512 shown in the example of FIG. 15. In other examples, the multiplexing means is implemented by hardware logic, hardware implemented state machines, logic circuitry, and/or any other combination of hardware, software, and/or firmware.

In the illustrated example of FIG. 1, the first PE column 118 is implemented by the first PE 126, the second PE 128, and the nth PE 130. In the example of FIG. 1, the first PE 126, the second PE 128, and the nth PE 130 reconstruct the sparsity bitmap at the first PE 126, the second PE 128, and the nth PE 130, respectively. The first PE 126, the second PE 128, and/or the nth PE 130 can be implemented by one or more of an arithmetic logic unit (ALU), one or more registers, and/or one or more transmission gates. In additional or alternative examples, the first PE 126, the second PE 128, and/or the nth PE 130 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In the illustrated example of FIG. 1, the first schedule-aware sparse distribution controller 102a processes activation data stored in the global memory 106. In additional or alternative examples, the schedule-aware sparse distribution controller can be included in the InSAD system 100 that processes weight data stored in the global memory 106. In such additional or alternative examples, the configuration descriptors of the configuration description controller 110 can be different for the respective schedule-aware sparse distribution controller that processes activation data and the respective schedule-aware sparse distribution controller that processes weight data.

The example InSAD system 100 illustrated in FIG. 1 can be implemented with machine learning accelerators to reduce data movement. The example InSAD system 100 combines both flexible tensor distribution and sparse data compression by (1) decoding ZVC data vectors with software programed byte select signals (e.g., Byte_Sel[0]-Byte_Sel[N]) to distribute non-zero data to respective PE arrays, (2) reconstructing the sparsity bitmap at each PE on the fly for different tensor shapes, (3) eliminating one or more storage requirements for uncompressed data across on-chip memory hierarchy, and (4) serving different tensor shapes (e.g., one or more multi-dimension array dimensions) for each PE. The examples disclosed herein are applicable to various dataflow-based accelerators.

Figure 2:
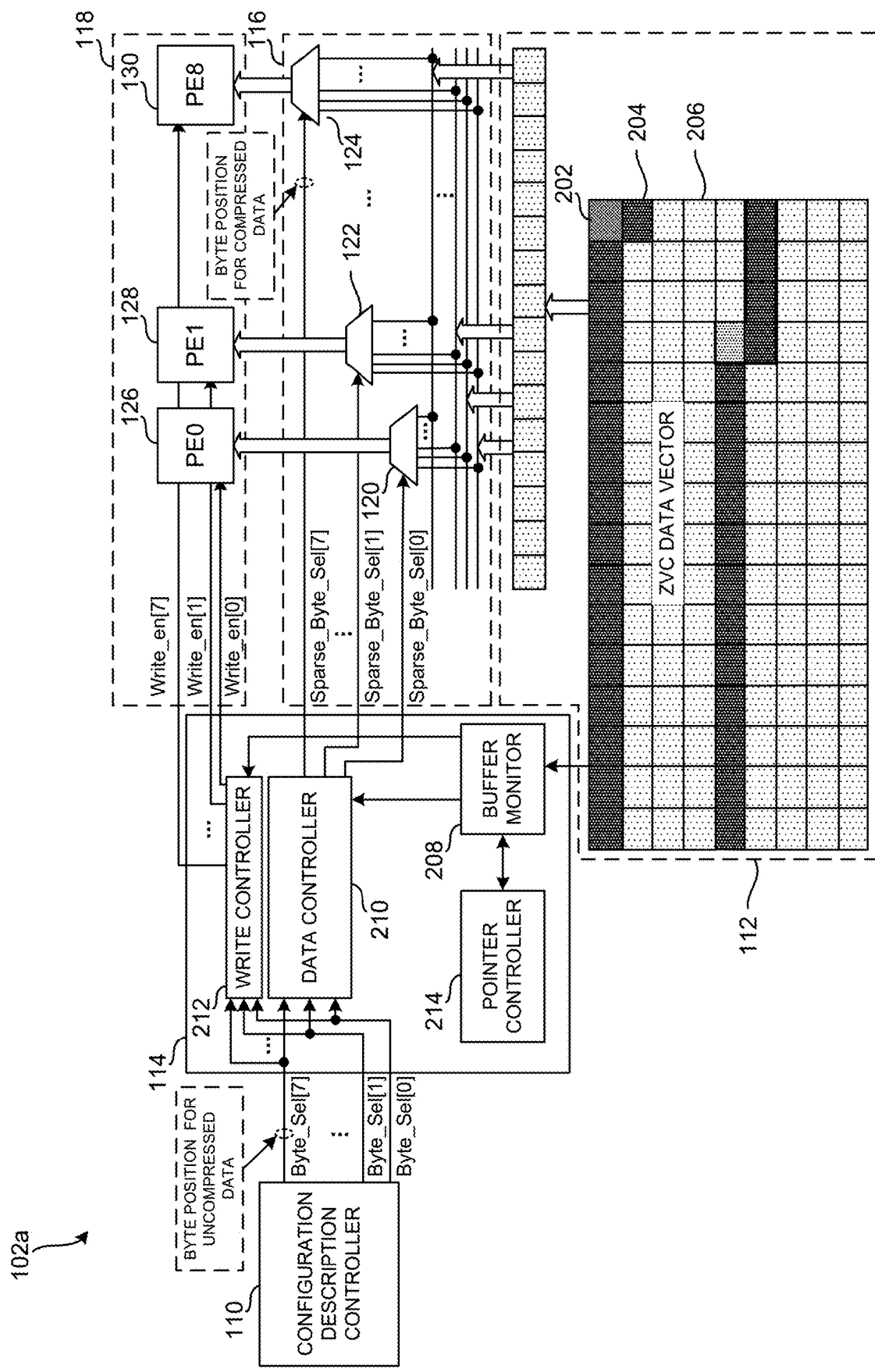
FIG. 2 is a block diagram showing an example implementation of the first schedule-aware sparse distribution controller of FIG. 1.

FIG. 2 is a block diagram showing an example implementation of the first schedule-aware sparse distribution controller 102a of FIG. 1. The example first schedule-aware sparse distribution controller 102a includes the example first input buffer 112, the example first sparse decoder 114, the example first multiplexer array 116, and the example first PE column 118. In the example of FIG. 2, the first input buffer 112 includes an example header 202, an example sparsity bitmap 204, and an example ZVC data vector 206. In the example of FIG. 2, the first sparse decoder 114 includes an example buffer monitor 208, an example data controller 210, an example write controller 212, and an example pointer controller 214. The first multiplexer array 116 includes the first multiplexer 120, the second multiplexer 122, and the nth multiplexer 124. The first PE column 118 includes the first PE 126, the second PE 128, and the nth PE 130. In the example of FIG. 2, the first multiplexer array 116 includes eight multiplexers driving eight PEs of the first PE column 118 (e.g., n=8). For example, the first schedule-aware sparse distribution controller 102a of FIG. 2 is a flexible schedule aware sparse decoder for one (1) PE column with eight (8) PEs per column.

The example of FIG. 2 illustrates the micro-architecture of the first sparse decoder 114 (e.g., the first flexible sparse decoder). The example first sparse decoder 114 obtains software programmed byte select signals (e.g. Byte_Sel[0]-Byte_Sel[7]) for each PE in a column as input. The example first sparse decoder 114 synchronizes the decoding operation of the sparsity bitmap. Examples disclosed herein assume the scheduling of the data distribution is identical between different PE columns. However, examples disclosed herein do not preclude other data distribution techniques. Each byte select signal determines the tensor shape and volume processed by each PE according to a schedule, which is sparsity independent.

In the illustrated example of FIG. 2, the first input buffer 112 includes the header 202. In the example of FIG. 2, the header 202 indicates whether the data following the header is uncompressed or whether the data following the header includes a sparsity bitmap and a ZVC data vector. For example, the buffer monitor 208, and/or, more generally, the first sparse decoder 114 determines whether the first input buffer 112 includes compressed or uncompressed data based on the header 202. For example, if the header 202 includes a value that is not 0xff in hexadecimal code (hex) (e.g., 255 in decimal), then the header 202 includes a value indicative to the buffer monitor 208, and/or, more generally, the first sparse decoder 114 that the data following the header 202 is compressed. In examples disclosed herein, compressed data includes a sparsity bitmap (e.g., the sparsity bitmap 204) and a ZVC data vector (e.g., the ZVC data vector 206). In the example of FIG. 2, if the header 202 includes a value that is 0xff in hex (e.g., 255 in decimal), then the header 202 includes a value indicative to the buffer monitor 208, and/or, more generally, the first sparse decoder 114 that the data following the header 202 is uncompressed. In the example of FIG. 2, the data following a header (e.g., the header 202) indicating compressed data (e.g., the header 202≠0xff) includes a 16-byte sparsity bitmap (e.g., the sparsity bitmap 204) and a ZVC data vector (e.g., the ZVC data vector) that corresponds to 128 bytes of uncompressed data. In the example of FIG. 2, the data following a header (e.g., the header 202) indicating uncompressed data (e.g., the header 202=0xff) includes 128 bytes of uncompressed data.

In the illustrated example of FIG. 2, the buffer monitor 208 is coupled to the first input buffer 112, the data controller 210, the write controller 212, and the pointer controller 214. In the example of FIG. 2, the buffer monitor 208 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In the illustrated example of FIG. 2, the buffer monitor 208 monitors the first input buffer 112, reads data from the first input buffer 112, and/or provides data from the first input buffer 112 to the data controller 210 and/or the write controller 212. In the example of FIG. 2, the buffer monitor 208 monitors the first input buffer 112 for a header (e.g., the header 202). In examples disclosed herein, the header includes one (1) byte of data. In other examples, the header can include any number of bits.

In some examples, the example buffer monitor 208 implements an example means for monitoring. The example monitoring means is structure, and is implemented by executable instructions such as that implemented by at least blocks 1202, 1204, 1210, 1212, 1226, and 1246 of FIG. 12. For example, the executable instructions of blocks 1202, 1204, 1210, 1212, 1226, and 1246 of FIG. 12 may be executed on at least one processor such as the example processor 1512 shown in the example of FIG. 15. In other examples, the monitoring means is implemented by hardware logic, hardware implemented state machines, logic circuitry, and/or any other combination of hardware, software, and/or firmware.

In the illustrated example of FIG. 2, the data controller 210 is coupled to the configuration description controller 110 and the first multiplexer array 116. For example, the data controller 210 provides (a) the first multiplexer 120 with the first sparse byte select signal (e.g., Sparse_Byte_Sel[0]), (b) the second multiplexer 122 with the second sparse byte select signal (e.g., Sparse_Byte_Sel[1]), and (c) the eighth multiplexer 124 with the eighth sparse select signal (e.g., Sparse_Byte_Sel[7]). In the example of FIG. 2, the data controller 210 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In the illustrated example of FIG. 2, the data controller 210 generates the sparse byte select signals (e.g., Sparse_Byte_Sel[0]-Sparse_Byte_Sel[7]) based on the byte select signals (Byte_Sel[0]-Byte_Sel[7]) and/or the sparsity bitmap (e.g., the sparsity bitmap 204). For example, the data controller 210 generates the sparse byte select signals based on the following function:

$$\text{Sparse\_byte\_sel}\_i = \text{Popcount}[SB(\text{byte\_sel}\_i,0)] - 1 \quad \text{Function—(A)}$$

In the illustrated example of Function (A), Popcount[SB(byte_sel_i,0)] is a sum of 1's in a sub-vector of the sparsity bitmap (SB) from the bit position of the byte select signal (e.g., byte_sel_i) to bit position 0. In examples disclosed herein the sparse byte signals (e.g. Sparse_Byte_Sel[0]-Sparse_Byte_Sel[7]) are sparsity-aware byte select signals to control the first multiplexer array 116, which apply to a first portion of data from the first input buffer 112 and route the data to the designated PEs. In examples disclosed herein, the portion of the data from the first input buffer 112 corresponds to 16-bytes of data. In examples disclosed herein, subtracting one ensures that the data controller 210 generates the correct value for the sparse byte select signal. For example, if it is desirable for the data controller 210 to select a fifth element of data in the first input buffer 112 (e.g., the data at the fifth multiplexer (not shown)), then the sparse byte select signal should be adjusted from five to four which is [1 0 0] in binary. In such an example, this is because the first data element is chosen with zero (e.g., [0 0 0] in binary) as the sparse byte select signal.

In some examples, the data controller 210 implements example means for controlling data. The data controlling means is structure, and is implemented by executable instructions, such as those implemented by at least block 1238 of FIG. 12 and/or at least blocks 1306, 1308, and 1310 of FIG. 13. For example, the executable instructions of block 1238 of FIG. 12 and/or at least blocks 1306, 1308, and 1310 of FIG. 13 may be executed on at least one processor such as the example processor 1512 shown in the example of FIG. 15. In other examples, the data controlling means is implemented by hardware logic, hardware implemented state machines, logic circuitry, and/or any other combination of hardware, software, and/or firmware.

In the illustrated example of FIG. 2, the write controller 212 is coupled to the configuration description controller 110 and the first PE column 118. For example, the write controller 212 provides (a) the first PE 126 with the first write enable signal (e.g., Write_en[0]), (b) the second PE 128 with the second write enable signal (e.g., Write_en[1]), and (c) the eighth PE 130 with the eighth write enable signal (e.g., Write_en[7]). In the example of FIG. 2, the write controller 212 can be implemented by one or more analog or digital circuit(s), logic circuits, programmable processor(s), programmable controller(s), GPU(s), DSP(s), application specific integrated circuit(s) ASIC(s), PLD(s) and/or FPLD(s).

In the example of FIG. 2, the write controller 212 generates the write enable signals (e.g., Write_en[0]-Write_en[7]) based on the byte select signals (Byte_Sel[0]-Byte_Sel[7]). For example, the write controller 212 generates the write enable signals based on the following example function:

$$\text{Write\_en}\_i = SB(\text{Byte\_sel}\_i) \quad \text{Function—(B)}$$

In the illustrated example of Function (B), SB(byte_sel_i) is the value of the sparsity bitmap (e.g., the sparsity bitmap 204) at the binary bit position corresponding to the value of the byte select signal (e.g., byte_sel_i). In examples disclosed herein, the write enable signals (e.g. Write_en[0]-Write_en[7]) indicate whether the data transmitted to a given PE is non-zero (valid, 1, etc.) or zero (invalid, 0, etc.).

In some examples, the example write controller 212 implements example means for controlling writing. The write controlling means is structure, and is implemented by executable instructions, such as those implemented by at least block 1236 of FIG. 12 and/or at least blocks 1302 and 1304 of FIG. 13. For example, the executable instructions of block 1236 of FIG. 12 and/or at least blocks 1302 and 1304 of FIG. 13 may be executed on at least one processor such as the example processor 1512 shown in the example of FIG. 15. In other examples, the write controlling means is implemented by hardware logic, hardware implemented state machines, logic circuitry, and/or any other combination of hardware, software, and/or firmware.

In the illustrated example of FIG. 2, the data controller 210 and/or the write controller 212 decode the sparsity bitmap based on the schedule dependent byte select signals (e.g. Byte_Sel[0]-Byte_Sel[7]) to translate the byte select signals to the write enable signals (e.g. Write_en[0]-Write_en[7]) and the sparse byte select signals (e.g. Sparse_Byte_Sel[0]-Sparse_Byte_Sel[7]). Examples disclosed herein allow a software program to define the tensor data distribution where the software program does not need to be aware of the sparsity in the data. Additionally, the byte select signals input into the schedule-aware sparse distribution controllers disclosed herein can be programmed per DNN layer, which can be highly flexible with the data flow preference.

In the illustrated example of FIG. 2, the pointer controller 214 is coupled to the buffer monitor 208. In the example of FIG. 2, the pointer controller 214 can be implemented by one or more analog or digital circuit(s), logic circuits, programmable processor(s), programmable controller(s), GPU(s), DSP(s), application specific integrated circuit(s) ASIC(s), PLD(s) and/or FPLD(s). The example pointer controller 214 controls the location of the pointer of the first sparse decoder 114 in the first input buffer 112 and the location of the pointer of the first multiplexer array 116 in the first input buffer 112.

In some examples, the pointer controller 214 implements example means for controlling pointers. The pointer controlling means is structure, and is implemented by executable instructions, such as those implemented by at least blocks 1206, 1214, 1228, 1232, and 1250 of FIG. 12. For example, the executable instructions of blocks 1206, 1214, 1228, 1232, and 1250 of FIG. 12 may be executed on at least one processor such as the example processor 1512 shown in the example of FIG. 15. In other examples, the pointer controlling means is implemented by hardware logic, hardware implemented state machines, logic circuitry, and/or any other combination of hardware, software, and/or firmware.

In operation, the example buffer monitor 208 determines whether a header (e.g., the header 202) has been detected in the first input buffer 112. In response to not detecting a header, the buffer monitor 208 continues to monitor the first input buffer 112 for a header. In response to detecting a header (e.g., the header 202), the buffer monitor 208 reads the header (e.g., the header 202). Subsequently, the pointer controller 214 translates the pointer of the first sparse decoder 114 and the pointer of the first multiplexer array 116 one byte in the first input buffer 112. The first sparse decoder 114 also reads a first set of byte select signals from the configuration description controller 110. The buffer monitor 208 additionally determines whether the header (e.g., the header 202) indicates that the data following the header is compressed data. In response to the header indicating that the data following the header include a sparsity bitmap and compressed data (e.g., the header 202≠0xff), the buffer monitor 208 reads the sparsity bitmap (e.g., the sparsity bitmap 204) from the first input buffer 112. In the example of FIG. 2, sparsity bitmaps (e.g., the sparsity bitmap 204) include 16 bytes. In additional or alternative examples, sparsity bitmaps can include any number of bits.

In example operation, after reading the sparsity bitmap (e.g., the sparsity bitmap 204) from the first input buffer 112, the pointer controller 214 translates the pointer of the first multiplexer array 116 the number of bits equal to the length of the sparsity bitmap (e.g., 16 bytes). The first multiplexer array 116 then reads a first portion of a ZVC data vector (e.g., the ZVC data vector 206) from the first input buffer 112. For example, the first multiplexer array 116 can read a 16-byte portion of the ZVC data vector 206 from the first input buffer 112.

In example operation, the first sparse decoder 114 then decodes a portion of the sparsity bitmap (e.g., the sparsity bitmap 204) that corresponds to the first portion of the ZVC data vector (e.g., the ZVC data vector 206) and a first set of byte select signals (e.g., Byte_Sel[0]-Byte_Sel[N]). For example, the write controller 212 determines the value of a bit at a position in the sparsity bitmap (e.g., the sparsity bitmap 204) corresponding to the value of the byte select signal for a given PE (e.g., Byte_Sel[0] for the first PE 126). Based on the value of the byte select signal for the given PE, the write controller 212 sets the write enable signal for the given PE (e.g., Write_en[0]) equal to the value of the bit at the position in the sparsity bitmap corresponding to the byte select signal value (e.g., Byte_Sel[0]). Additionally, for example, the data controller 210 determines the value of the bits between (a) the position in the sparsity bitmap (e.g., the sparsity bitmap 204) corresponding to the value of the byte select signal for a given PE (e.g., Byte_Sel[0] for the first PE 126) and (b) the least significant bit (LSB) of the sparsity bitmap (e.g., the sparsity bitmap 204). In such an example, the data controller 210 also sums the values of the bits between (a) the position in the sparsity bitmap (e.g., the sparsity bitmap 204) corresponding to the value of the byte select signal for a given PE (e.g., Byte_Sel[0] for the first PE 126) and (b) the LSB of the sparsity bitmap (e.g., the sparsity bitmap 204) and sets the sparse byte select signal for the given PE (e.g., Sparse_Byte_Sel[0] for the first PE 126) equal to the summed value minus one.

For example, for a 16 bit segment of the sparsity bitmap (SB), assuming n=8, for PE_i where i is {0, 1, . . . , 7}, Write_en_i and Sparse_byte_sel_i for PE_i are generated as follows. That is, if the first portion of the example sparsity bitmap 204 is [0 1 1 1 1 0 1 0 0 0 0 1 1 0 1 1] where the right most bit is the LSB and the fourth byte select signal (e.g., Byte_Sel[3]) is 9 for the fourth PE (not shown), then the write controller 212 will set the fourth write enable signal (e.g., Write_en[3]) to 1 (e.g., corresponding to the ninth bit position of the portion of the sparsity bitmap 204). Additionally, in such an example, the data controller 210 will set the fourth sparse byte select signal (e.g., Sparse_Byte_Sel[3]) to 4. For example, the sum of all the 1's in the sub-vector of the portion of the sparsity bitmap 204 (e.g., sparsity bitmap 204 (9,0)=[1 0 0 0 0 1 1 0 1 1]) is 5 and minus 1 is 4. In such an example, the value of the fourth sparse byte select signal (e.g., Sparse_Byte_Sel[3]) for the fourth PE corresponds to the fourth byte position in the compressed data read by the first multiplexer array 116. Based on the fourth sparse byte select signal (e.g., Sparse_Byte_Sel[3]), the fourth multiplexer (not shown) transmits the fourth byte in the 16-byte portion of the ZVC data vector (e.g., the ZVC data vector 206). As such, the fourth PE (not shown) will receive and process the fourth byte of data in the 16-byte portion of the ZVC data vector (e.g., the ZVC data vector 206) read by the first multiplexer array 116. Detailed operation of an example PE in accordance with the teachings of this disclosure is described in connection with FIG. 3.

In example operation, if there are additional byte select signals in the first set of byte select signals that have not been processed, the write controller 212, the data controller 210, and/or, more generally, the first sparse decoder 114 decodes the next portion of the sparsity bitmap corresponding to the portion of the ZVC data vector and the next byte select signal of the current set. After all of the portion of the sparsity bitmap corresponding to the portion of the ZVC data vector for the current set of byte select signals has been decoded, the buffer monitor 208 determines whether there are any additional portions of the ZVC data vector in the first input buffer 112. If there are no additional portions of the ZVC data vector in the first input buffer 112, the buffer monitor 208 monitors the first input buffer 112. In response to determining that there are additional portions of the ZVC data vector in the first input buffer 112, the pointer controller 214 translates the pointer of the first sparse decoder 114 the number of bits equal to the first portion of the sparsity bitmap (e.g., 16 bits). Subsequently, the write controller 212, the data controller 210, and/or, more generally, the first sparse decoder 114 reads an additional set of byte select signals from the configuration description controller 110. In example operation, the pointer controller 214 translates the pointer of the first multiplexer array 116 a number of bits equal to the portion of the ZVC data vector.

Alternatively, in example operation, if the buffer monitor 208 determines that the header indicates that the data in the first input buffer 112 is not compressed (e.g., the header 202=0xff), the first multiplexer array 116 then reads a first portion of uncompressed data from the first input buffer 112. For example, the first multiplexer array 116 reads a 16-byte portion of data from the first input buffer 112. In example operation, the write controller 212 sets the write enable signal for a given PE (e.g., Write_en[0] for the first PE 126) equal to one. Additionally, for example, the data controller 210 sets the sparse byte select signal for the given PE (e.g., Sparse_Byte_Sel[0] for the first PE 126) equal to the byte select signal for the given PE (e.g., Byte_Sel[0]).

In example operation, based on the sparse byte select signal for the given PE (e.g., Sparse_Byte_Sel[0] for the first PE 126), the first multiplexer 120 transmits the data in the 16-byte portion of the uncompressed data to the first PE 126. If there are additional byte select signals in the first set of byte select signals that have not been processed, the example write controller 212 sets the write enable signal for the additional PE (e.g., Write_en[1] for the second PE 128) equal to one. After the portion of the uncompressed data for the current set of byte select signals has been processed, the respective PEs (e.g., the first PE 126, the second PE 128, the eighth PE 130, etc.) associated with the current set of byte select signals process the data received from the first multiplexer array 116. Detailed operation of an example PE in accordance with the teachings of this disclosure is described in connection with FIG. 3.

In operation, the example buffer monitor 208 determines whether there are any additional portions of the uncompressed data in the example first input buffer 112. If there are no additional portions of the uncompressed data in the example first input buffer 112, the example buffer monitor 208 monitors the example first input buffer 112. In response to determining that there are additional portions of the uncompressed data in the example first input buffer 112, the example pointer controller 214 translates the pointer of the example first multiplexer array 116. For example, the pointer controller 214 translates the pointer of the first multiplexer 116 a number of bits equal to the first portion of the uncompressed data (e.g., 16 bytes). Subsequently, the write controller 212, the data controller 210, and/or, more generally, the first sparse decoder 114 reads an additional set of byte select signals from the configuration description controller 110. In operation, the pointer controller 214 translates the pointer of the first multiplexer array 116 a number of bits equal to the portion of the ZVC data vector.

Figure 3:
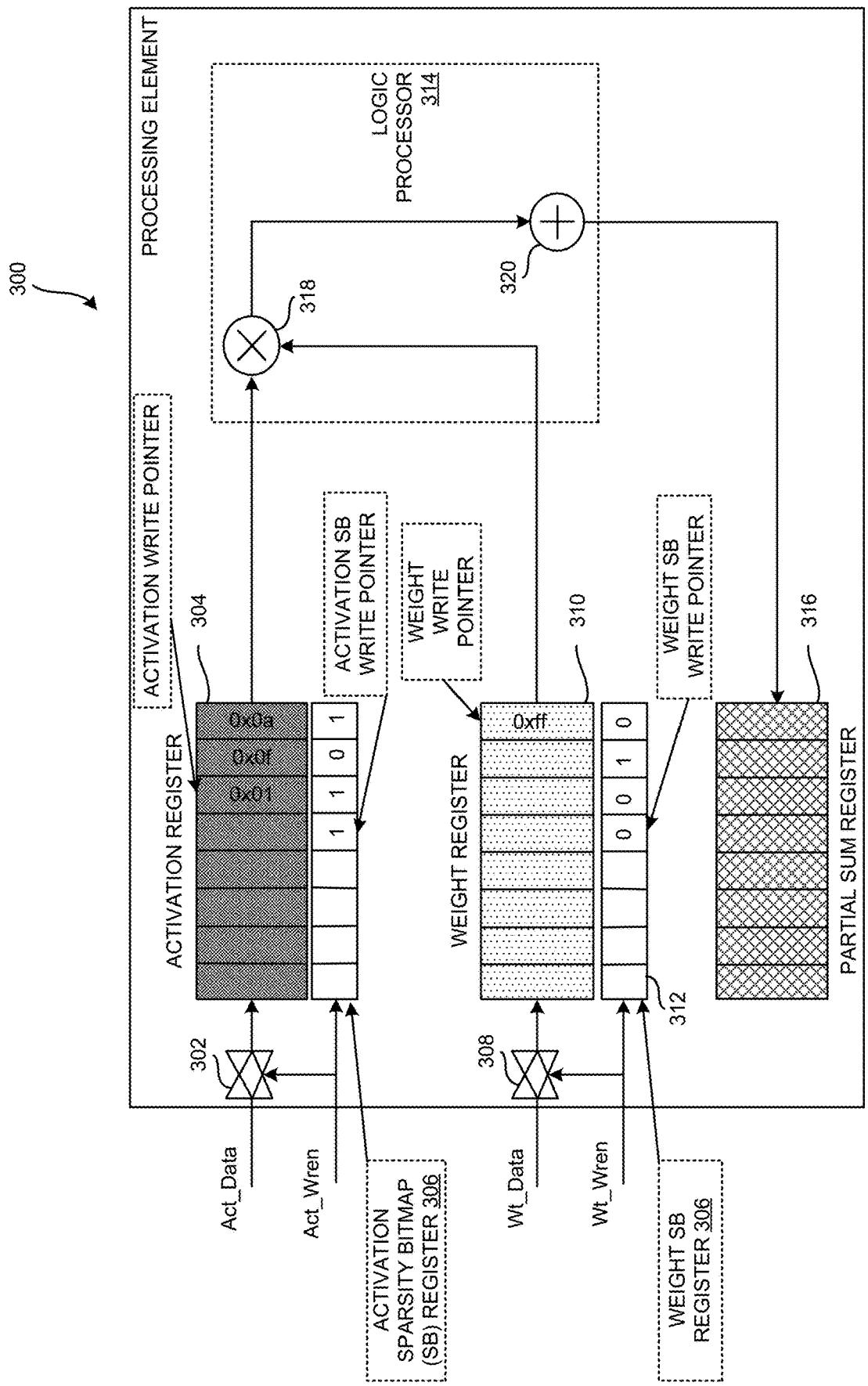
FIG. 3 is a block diagram of an example processing element constructed in accordance with the teachings of this disclosure.

FIG. 3 is a block diagram of an example processing element (PE) 300 constructed in accordance with the teachings of this disclosure. For example, the PE 300 is an example implementation of the first PE 126 constructed on accordance with an example InSAD system including schedule-aware sparse distribution controllers for input activation data and duplicate components for input weight data. In examples disclosed herein, the sparsity bitmap for a given ZVC data vector is reconstructed at each PE. For example, the disclosed PE (e.g., the PE 300) advantageously reduces on-chip storage overhead for decompressed data after sparsity decode operations. For example, the disclosed PEs (e.g., the first PE 126, the second PE 128, the nth PE 130, etc.) regenerate the sparsity bitmap at each PE based on its distributed tensor volume.

In some examples, the processing element (PE) 300 implements a means for processing. The processing means is structure, and is implemented by executable instructions, such as those implemented by at least blocks 1222 and 1242 of FIG. 12 and/or at least blocks 1402, 1404, 1406, 1408, 1410, 1412, 1414, 1416, 1418, 1420, 1422, 1424, 1426, and 1428 of FIG. 14. For example, the executable instructions of blocks 1222 and 1242 of FIG. 12 and/or blocks 1402, 1404, 1406, 1408, 1410, 1412, 1414, 1416, 1418, 1420, 1422, 1424, 1426, and 1428 of FIG. 14 may be executed on at least one processor such as the example processor 1512 shown in the example of FIG. 15. In other examples, the processing means is implemented by hardware logic, hardware implemented state machines, logic circuitry, and/or any other combination of hardware, software, and/or firmware.

In the illustrated example of FIG. 3, the PE 300 includes an example activation transmission gate 302, an example activation register 304, an example activation sparsity bitmap register 306, an example weight transmission gate 308, an example weight register 310, an example weight sparsity bitmap register 312, example logic processor 314, and an example partial sum register 316. The example logic processor 314 includes an example multiplier 318, and an example adder 320.

In the illustrated example of FIG. 3, the activation transmission gate 302 is coupled to the output of a multiplexer (e.g., the first multiplexer 120) in a multiplexer array (e.g., the first multiplexer array 116) and a write controller (e.g., the write controller 212). The activation register 304 is coupled to the output of the activation transmission gate 302 and to the multiplier 318. The activation sparsity bitmap register 306 is coupled to the write controller (e.g., the write controller 212).

In operation, the example logic processor 314 executes a multiply and accumulate (MAC) operation. For example, the logic processor 314 at least one of reads the data from the example activation register 304 and the weight register 310, performs computation (e.g., via the multiplier 318 and the adder 320), and writes back to the example partial sum register 316. As shown in FIG. 3, the activation data signal (e.g., Act_Data) at the activation transmission gate 302 and the activation write enable signal (e.g., Act_Write_en) at the activation transmission gate 302 are produced by an activation sparse decoder (e.g., the first sparse decoder 114). Additionally, the weight data signal (e.g., Wt_Data) at the weight transmission gate 308 and the weight write enable signal (e.g., Wt_Write_en) at the weight transmission gate 308 are produced by a weight sparse decoder (e.g., a duplicate of the first sparse decoder 114). The activation write enable signal (e.g., Act_Write_en) and the weight write enable signal (e.g., Wt_Write_en) facilitate construction of the sparsity bitmap within the PE 300 and prevent writing the zero data in the register files (e.g., the activation register 304 and/or the weight register 310).

In the example of FIG. 3, the activation write enable signal (e.g., Act_Write_en) is sequentially generated as 1, 0, 1, 1, and the weight write enable signal (e.g., Wt_Write_en) is sequentially generated as 0, 1, 0, 0. Thus, the activation sparsity bitmap (Act SB) is [1 0 1 1] and the weight sparsity bitmap is [0 1 0 0]. Because three activations are non-zero, and one weight is non-zero, the write pointer of activation register 304 advances three entries while the write pointer of weight register 310 advances one entry. Thus, as data is loaded into the activation register 306 via the activation write enable signal and the weight register 310 via the weight write enable signal, the sparsity bitmaps for both the activation data signal and the weight data signal are reconstructed at the PE 300. As such, the data in the register file (e.g., the activation register 304, the weight register 310, etc.) remains in compressed format. In examples disclosed herein, for different schedules, the tensor shape and volume may vary. Because the sparsity bitmap in a PE carries both schedule and sparsity information, the reconstructed sparsity bitmap also reflects an improved data flow.

In some examples, the activation transmission gate 302 implements example means for activation transmitting. The activation transmitting means is structure, and is implemented by executable instructions, such as those implemented by at least blocks 1402, 1404, and 1406 of FIG. 14. For example, the executable instructions of blocks 1402, 1404, and 1406 of FIG. 14 may be executed on at least one processor such as the example processor 1512 shown in the example of FIG. 15. In other examples, the activation transmitting means is implemented by hardware logic, hardware implemented state machines, logic circuitry, and/or any other combination of hardware, software, and/or firmware.

In some examples, the example activation register 304 implements example means for storing activations. The activation storing means is structure, and is implemented by executable instructions, such as those implemented by at least blocks 1408 and 1410 of FIG. 14. For example, the executable instructions of blocks 1408 and 1410 of FIG. 14 may be executed on at least one processor such as the example processor 1512 shown in the example of FIG. 15. In other examples, the activation storing means is implemented by hardware logic, hardware implemented state machines, logic circuitry, and/or any other combination of hardware, software, and/or firmware.

In some examples, the example weight transmission gate 308 implements example means for weight transmitting. The weight transmitting means is structure, and is implemented by executable instructions, such as those implemented by at least blocks 1412, 1414, and 1416 of FIG. 14. For example, the executable instructions of blocks 1412, 1414, and 1416 of FIG. 14 may be executed on at least one processor such as the example processor 1512 shown in the example of FIG. 15. In other examples, the weight transmitting means is implemented by hardware logic, hardware implemented state machines, logic circuitry, and/or any other combination of hardware, software, and/or firmware.

In some examples, the example weight register 310 implements example means for storing weights. The weight storing means is structure, and is implemented by executable instructions, such as those implemented by at least blocks 1418 and 1420 of FIG. 14. For example, the executable instructions of blocks 1418 and 1420 of FIG. 14 may be executed on at least one processor such as the example processor 1512 shown in the example of FIG. 15. In other examples, the weight storing means is implemented by hardware logic, hardware implemented state machines, logic circuitry, and/or any other combination of hardware, software, and/or firmware.

In some examples, the example logic processor 314 implements example means for processing activations and weights. The activations and weights processing means is structure, and is implemented by executable instructions, such as those implemented by at least blocks 1422, 1424, and 1426 of FIG. 14. For example, the executable instructions of blocks 1422, 1424, and 1426 of FIG. 14 may be executed on at least one processor such as the example processor 1512 shown in the example of FIG. 15. In other examples, the activations and weights processing means is implemented by hardware logic, hardware implemented state machines, logic circuitry, and/or any other combination of hardware, software, and/or firmware.

In some examples, the example multiplier 318 implements example means for multiplying. The multiplying means is structure, and is implemented by executable instructions, such as those implemented by at least blocks 1422 and 1424 of FIG. 14. For example, the executable instructions of blocks 1422 and 1424 of FIG. 14 may be executed on at least one processor such as the example processor 1512 shown in the example of FIG. 15. In other examples, the multiplying means is implemented by hardware logic, hardware implemented state machines, logic circuitry, and/or any other combination of hardware, software, and/or firmware.

In some examples, the example adder 320 implements example means for adding. The adding means is structure, and is implemented by executable instructions, such as those implemented by at least block 1428 of FIG. 14. For example, the executable instructions of block 1428 of FIG. 14 may be executed on at least one processor such as the example processor 1512 shown in the example of FIG. 15. In other examples, the adding means is implemented by hardware logic, hardware implemented state machines, logic circuitry, and/or any other combination of hardware, software, and/or firmware.

FIG. 4 is a graphical illustration of an example mapping of zero-value-compression (ZVC) of sparse data in the first input buffer 112 of FIGS. 1 and 2. In the example of FIG. 4, the first input buffer 112 includes the header 202, the sparsity bitmap 204, and the ZVC data vector 206. FIG. 4 illustrates the data layout in the first input buffer 112 for a ZVC data vector corresponding to 128 bytes of uncompressed data where the least significant bit (LSB) is on the right. In the example of FIG. 4, the sparsity bitmap 204 includes 16 bytes, where 1 bit in the sparsity bitmap 204 represents a zero or non-zero byte. The compressed sparse data layout in the first input buffer 112 includes a one byte header (e.g., the header 202), followed by a 16 byte sparsity bitmap (e.g., the sparsity bitmap 204), and a ZVC data vector (e.g., the ZVC data vector 206) corresponding to 128 bytes of uncompressed data. Following the ZVC data vector 206 is the header for any number of subsequent sparsity bitmaps and any number of subsequent ZVC data vectors.

In the illustrated example of FIG. 4, the header 202 includes one byte to identify whether the data following the header is compressed or uncompressed. The example header 202 allows for both compressed and uncompressed data to exist during loading operations to processing elements. A drawback of ZVC in traditional implementations of zero-value-compression is that for ZVC data vectors (e.g., ZVC data vectors in the first few layers of DNNs and/or when different rectifying functions are used for non-linearity, etc.), the sparsity bitmap for decoding the ZVC data vector consumes about 12.5% overhead compared to the uncompressed case. However, the header disclosed herein indicates compressed data or uncompressed data and as such, the compression overhead for ZVC data vectors is reduced. To indicate compressed data, the header can be set to equal any value other than 0xff in hexadecimal (e.g., the header 202 0xff). When the buffer monitor 208 determines that the header 202 indicates the data is compressed during read of the first input buffer 112 (e.g., the header 202≠0xff), the buffer monitor 208 reads a 16 bit segment of the sparsity bitmap 204 from the first input buffer 112 and the first multiplexer array 116 reads 16 bytes of consecutive data from the first input buffer 112 each cycle.

FIG. 5 is a graphical illustration of an example mapping of uncompressed dense data in the first input buffer 112 of FIGS. 1 and 2. The example first input buffer 112 includes the example header 202 and an example dense vector 502. FIG. 5 illustrates an uncompressed dense data layout 500 where the header is set to equal 0xff in hexadecimal (e.g., the header 202=0xff). Because there is no compression, the data layout is the header followed by uncompressed data (e.g., the dense vector 502). While the example of FIGS. 4 and 5 illustrate compressed and uncompressed data for 128 bytes, examples disclosed herein are not limited thereto.

Figure 6:
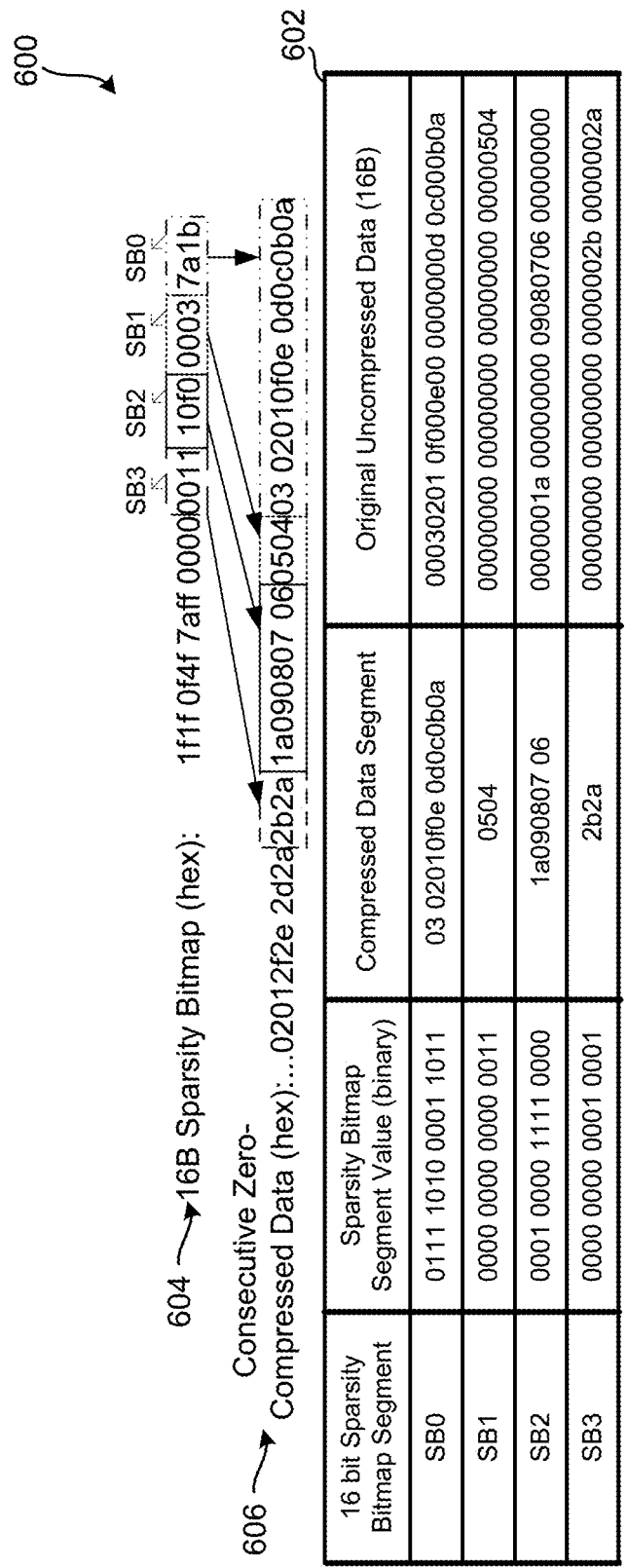
FIG. 6 is a table showing relationships between example uncompressed sparse data, an example portion of the sparsity bitmap, and an example portion of the zero-value-compression data vector of the sparse data.

FIG. 6 is an example table 600 showing relationships between example uncompressed sparse data 602, an example portion 604 of the sparsity bitmap 204, and an example portion 606 of the zero-value-compression (ZVC) data vector 206 of the sparse data. In the example of FIG. 6, values are represented in hexadecimal code (hex) unless otherwise indicated. FIG. 6 illustrates the example portion 604 of the sparsity bitmap 204 including four bytes, SB0, SB1, SB2, and SB3. FIG. 6 illustrates the mapping between the compressed data sequence (e.g., the portion 606 of the ZVC data vector 206) and the portion 604 of the sparsity bitmap 204. The uncompressed sparse data 602 is shown as reference.

In the illustrated example of FIG. 6, for the first byte of the portion 604 of the sparsity bitmap 204 (e.g., SB0=7a1b (hex)=[0 1 1 1 1 0 1 0 0 0 0 1 1 0 1 1]), corresponds to the portion 606 of the ZVC data vector 206 equivalent to [03 02010f0e 0 d0c0b0a]. The portion 606 of the ZVC data vector 206 equivalent to [03 02010f0e 0 d0c0b0a] corresponds to uncompressed sparse data 602 equivalent to [00030201 0f000e00 0000000 d 0c000b0a].

Figure 7:
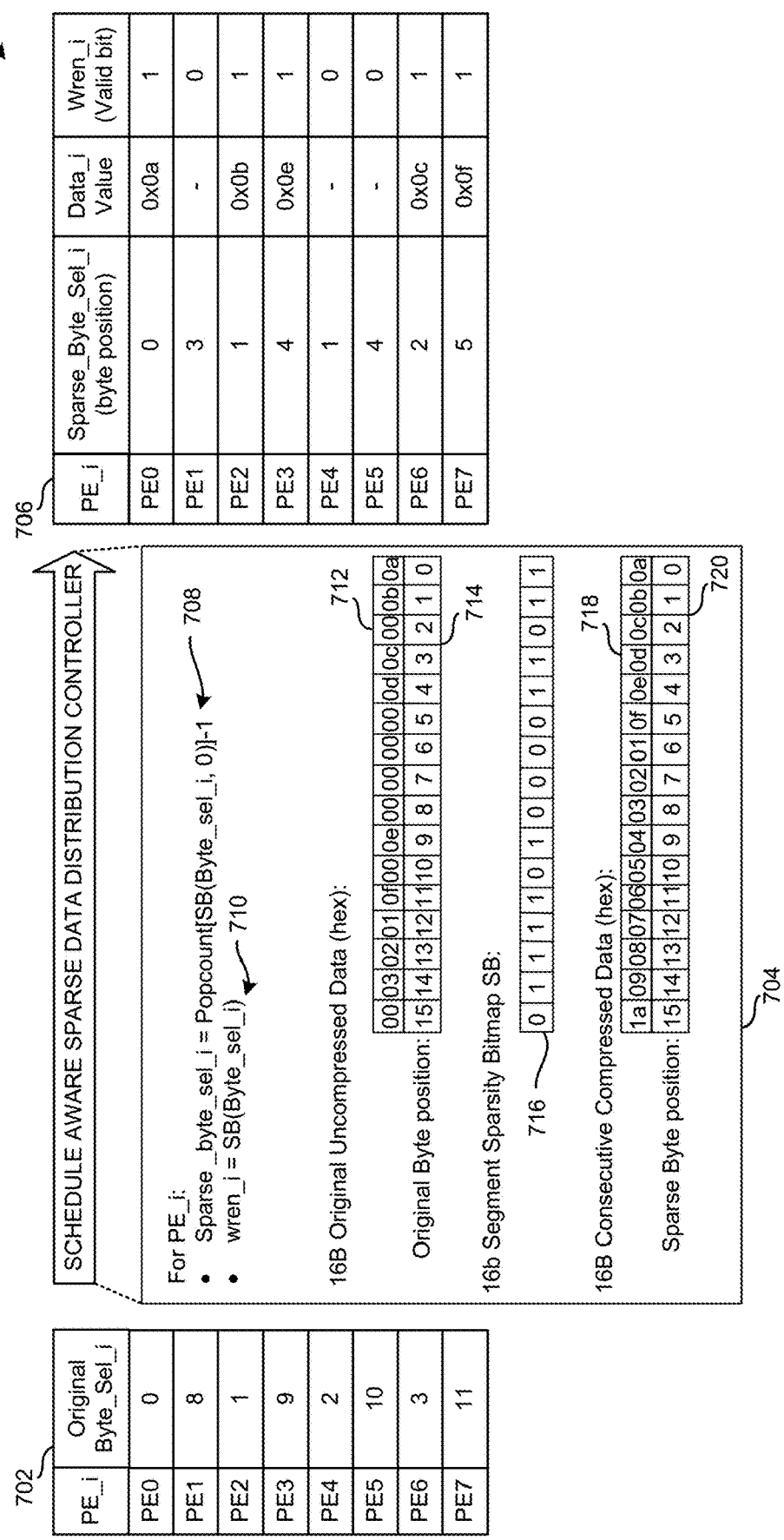
FIG. 7 is a graphical illustration showing example operation principles of the first schedule aware sparse data distribution controller of FIGS. 1 and 2.

FIG. 7 is an example graphical illustration 700 showing operation principles of the first schedule-aware sparse distribution controller 102a of FIGS. 1 and 2. The example graphical illustration 700 includes an example input table 702, an example process table 704, and an example output table 706. The example process table 704 includes an example first function 708, an example second function 710, an example uncompressed sparse vector 712, example original byte positions 714, an example portion of a sparsity bitmap 716, an example zero-value-compression (ZVC) data vector 718, and example sparse byte position 720.

In the illustrated example of FIG. 7, the first schedule-aware sparse distribution controller 102a obtains the software programmed byte select signals (e.g. Byte_Sel_i for PE0-PE7 in the input table 702 (e.g., Byte_Sel[0]-Byte_Sel [7])) for each PE in a column as input. Each byte select signal determines the tensor shape and volume processed by each PE (e.g., PE0-PE7 in the input table 702) according to a schedule, which is sparsity independent. As such, the byte select signals (e.g., Byte_Sel_i for PE0-PE7 in the input table 702) are sparsity independent and are applied to the compressed data after being processed by the first schedule-aware sparse distribution controller 102a to account for changes in byte position caused by ZVC.

In the illustrated example of FIG. 7, the number of PEs per column is n, in which n equals eight (e.g., PE0-PE7 in the input table 702). The first sparse decoder 114 for one PE column produces two sets of control signals: (1) write enable signals (e.g. Write_en[0]-Write_en[N]) to each PE, which indicate the data is non-zero (valid, 1, etc.) or zero (invalid, 0, etc.), and (2) sparsity-aware sparse byte select signals (e.g. Sparse_Byte_Sel[0]-Sparse_Byte_Sel[N]) to control the example first multiplexer array 116. In the example of FIG. 7, the first multiplexer array 116 routes 16 bytes of compressed data output from the first input buffer 112 to the designated PEs.

FIG. 7 illustrates example operation of the data controller 210, the write controller 212, the first sparse decoder 114, and/or, more generally, the first schedule-aware sparse distribution controller 102a for a 16 bit segment of the sparsity bitmap (SB) assuming n=8. As such, the example of FIG. 7 illustrates operation of the data controller 210, the write controller 212, the first sparse decoder 114, and/or, more generally, the first schedule-aware sparse distribution controller 102a for PE_i where i is {0, 1, . . . , 7} and the data controller 210 generates the sparse byte select signals (e.g., Sparse_Byte_Sel_i) for PE_i in a manner consistent with Function (A), and the write controller 212 generates the write enable signals (e.g., Write_en_i) for PE_i in a manner consistent with Function (B).

Sparse_byte_sel_$i$=Popcount[$SB$(byte_sel_$i$,0)]−1   Function—(A)

Write_en_$i$=$SB$(Byte_sel_$i$)   Function—(B)

In the example of FIG. 7, SB(Byte_sel_i) in the example Function (B) (e.g., the second function 710) corresponds to a bit position a given byte select signal (e.g., Byte_sel_i) of a binary vector SB. In the example of FIG. 7, Popcount[SB (Byte_sel_i, 0)] in the example Function (A) (e.g., the first function 708) corresponds to a sum of ones in a sub-vector of the sparsity bitmap 716 from the bit position of the byte select signal (e.g., Byte_sel_i in the input table 702) to bit position 0.

As shown in the process table 704, if the sparsity bitmap 716 is [0 1 1 1 1 0 1 0 0 0 0 1 1 0 1 1], where the right most bit is the least significant bit (LSB) and the byte select signal Byte_Sel[3] is nine for PE3, the write enable signal Write_en[3] is one (corresponding to the ninth bit position of SB). In such an example, the sparse_byte_sel3 is four (sum of all the ones in sub-vector SB(9,0)=[1 0 0 0 0 1 1 0 1 1] equals five, then minus one), which corresponds to the fourth byte position in the compressed data (e.g., the ZVC data vector 718), namely, 0x0e. 0x0e corresponds to the ninth byte position in the uncompressed sparse vector 712.

In the illustrated example of FIG. 7, the byte select signals (e.g., Byte_Sel[0]-Byte_Sel[7]) are different for all eight PEs in the first PE column 118. Examples disclosed herein allow for a software program to define the tensor data distribution where the software program does not need to be aware of the sparsity in the data. In the example of FIG. 7, the byte select signals (e.g., the input table 702) can be programmed per DNN layer, which can be highly flexible with the data flow preference. For 8 PEs per column, a total of 8 Popcounts are executed per column.

Figure 8:
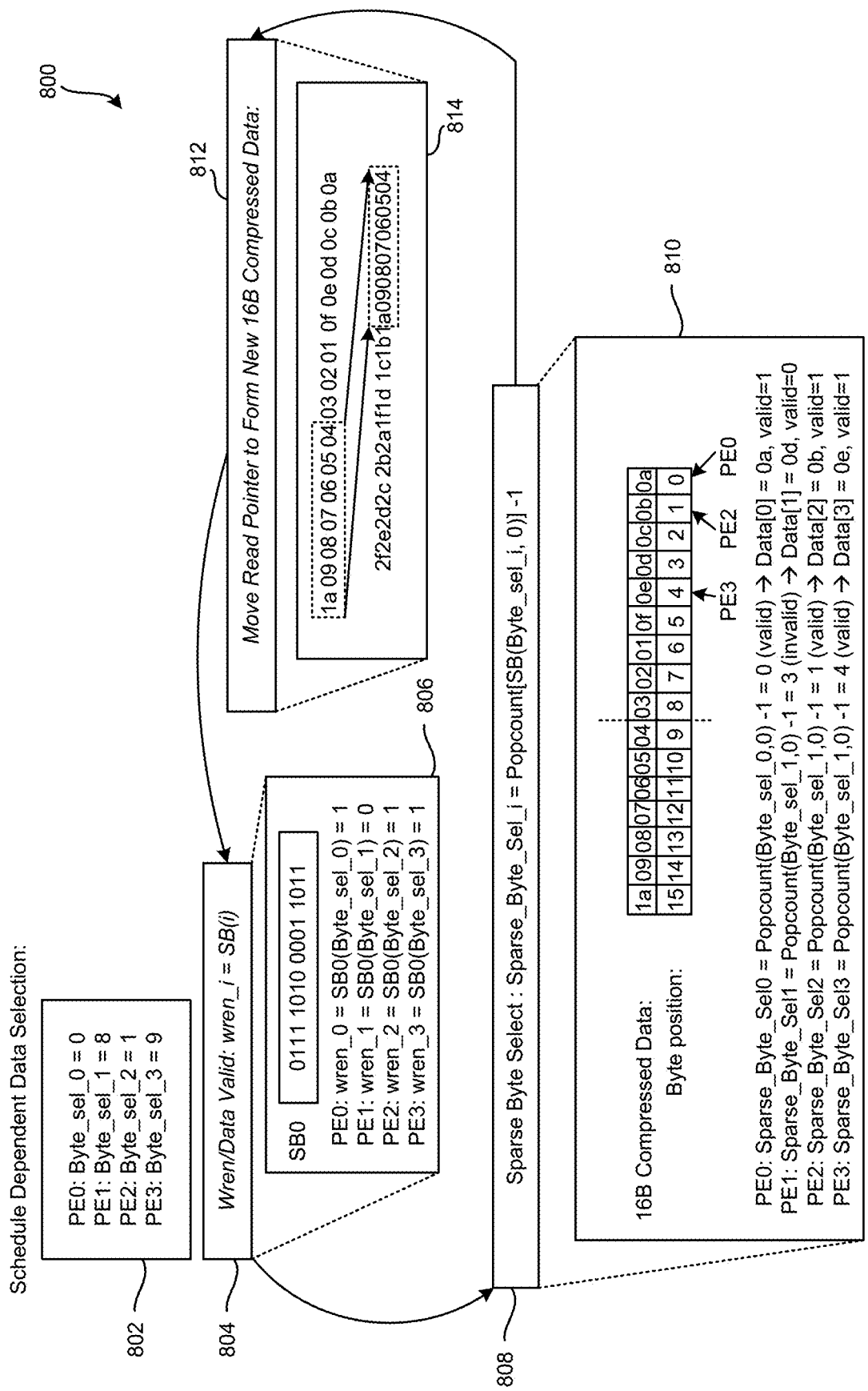
FIG. 8 is a state diagram showing example states of the first schedule aware sparse data distribution controller of FIGS. 1 and 2 when generating write enable signals and sparse byte select signals.

FIG. 8 is an example state diagram 800 showing various states of the first schedule-aware sparse distribution controller 102a of FIGS. 1 and 2 when generating write enable signals and sparse byte select signals. The example of FIG. 8 illustrates additional detail with respect to the first sparse decoder 114 generating the write enable signals (e.g., Write_en_i) and the sparse byte select signals (e.g., Sparse_Byte_Sel_i) for four processing elements (PEs) (e.g., PE0-PE3). The graphical illustration 800 includes example byte select signals 802, an example write state 804, example execution sequence list 806 of the write state 804, an example sparse byte select state 808, an example zero-value-compression (ZVC) data vector 809, example execution sequence list 810 of the sparse byte select state 808, an example pointer translation state 812, and example execution 814 of the pointer translation state 812.

In the illustrated example of FIG. 8, the byte select signals 802 include values for a first PE, PE0, a second PE, PE1, a third PE, PE2, and a fourth PE, PE3. In the example of FIG. 8, the first byte select signal (e.g., based on a software schedule) for the first PE is set to zero (e.g., Byte_Sel[0]=0). The second byte select signal for the second PE is set to eight (e.g., Byte_Sel[1]=8). The third byte select signal for the third PE is set to one (e.g., Byte_Sel[2]=1). The fourth byte select signal for the fourth PE is set to nine (e.g., Byte_Sel[3]=9).

In the illustrated example of FIG. 8, at the write state 804, the write controller 212 executes Function (B) to determine the write enable signals for the four PEs with a portion of [0 1 1 1 1 0 1 0 0 0 0 1 1 0 1 1] of a sparsity bitmap where the right most bit is the least significant bit (LSB). As illustrated in the execution sequence list 806 of the write state 804, the write controller 212 generates the first write enable signal as a one (e.g., Write_en[0]=1, the first bit in the sparsity bitmap). In the example of FIG. 8, the write controller 212 generates the second write enable signal as a zero (e.g., Write_en[1]=0, the ninth bit in the sparsity bitmap). The example write controller 212 generates the third write enable signal as a one (e.g., Write_en[2]=1, the second bit in the sparsity bitmap). In the example of FIG. 8, the write controller 212 generates the fourth write enable signal as a one (e.g., Write_en[3]=1, the tenth bit in the sparsity bitmap).

In the illustrated example of FIG. 8, after the write state 804 executes, the first sparse decoder 114 proceeds to the sparse byte select state 808. At the sparse byte select state 808, the data controller 210 determines (e.g., in a manner consistent with example Function (A)) the sparse byte select signals for the four multiplexers of the four PEs with the portion [0 1 1 1 1 0 1 0 0 0 0 1 1 0 1 1] of the sparsity bitmap where the right most bit is the LSB. As illustrated in the execution sequence list 810 of the sparse byte select state 808, the data controller 210 generates the first byte select signal as a one (e.g., Sparse_Byte_Sel[0]=0, the sum of the bits between the first bit and the first bit minus one). As such, for the example ZVC data vector 809 of [1a 09 08 07 06 05 04 03 02 01 0f 0e 0 d 0c 0b 0a], the first PE, PE0, receives the first byte, 0x0a. In the example of FIG. 8, the data controller 210 generates the second byte select signal as a three (e.g., Sparse_Byte_Sel[1]=0, the sum of the bits between the ninth bit and the first bit minus one). As such, for the given ZVC data vector 809, the second PE, PE1, is to receive the fourth byte, 0x0 d. However, because the value of the second write enable signal is zero (e.g., Write_en[1]= 0, signaling that no data is to be sent to PE1), no data is written to the second PE (e.g., PE1). The example data controller 210 generates the third byte select signal as a one (e.g., Sparse_Byte_Sel[2]=1, the sum of the bits between the second bit and the first bit minus one). As such, for the given ZVC data vector 809, the third PE, PE2, receives the second byte, 0x0b. In the example of FIG. 8, the data controller 210 generates the fourth byte select signal as a 4 (e.g., Sparse_Byte_Sel[3]=4, the sum of the bits between the tenth bit and the first bit minus one). As such, for the given ZVC data vector 809, the fourth PE, PE3, receives the fifth byte, 0x0e.

In the illustrated example of FIG. 8, after the byte select state 808 executes, the first sparse decoder 114 proceeds to execute the pointer translation state 812. At the pointer translation state 812, the pointer controller 214 translates the pointer of the first sparse decoder 114 and the pointer of the first multiplexer array 116. As illustrated in the execution 814 of the pointer translation state 812, the pointer controller 214 translates the pointer of the first multiplexer array 116. For example, the pointer controller 214 translates the pointer of the first multiplexer array 116 a first portion in the ZVC data vector 809. In the example of FIG. 8, the pointer controller 214 translates the pointer of the first multiplexer array 116 nine (9) bytes in the ZVC data vector 809. Additionally, the pointer controller 214 translates the pointer of the first sparse decoder 114 a first portion of the sparsity bitmap. In the example of FIG. 8, the pointer controller 214 translates the pointer of the first sparse decoder 114 two (2) bytes of the sparsity bitmap. After the pointer translation state 812, the first sparse decoder 114 returns to the write state 804.

In the illustrated example of FIG. 8, because the second write enable signal for the second PE, (e.g., PE1) equals zero (e.g., Write_en[1]=0), the data is invalid (as the sparsity bitmap index for the byte position is 0). Thus, the data will not be written within the register files of the second PE, PE1, and the data will skipped. As such, the bit for that byte in the bitmap will be set to false (e.g., 0). In this manner, only the compressed values are loaded within a given PE.

Figures 9, 10:
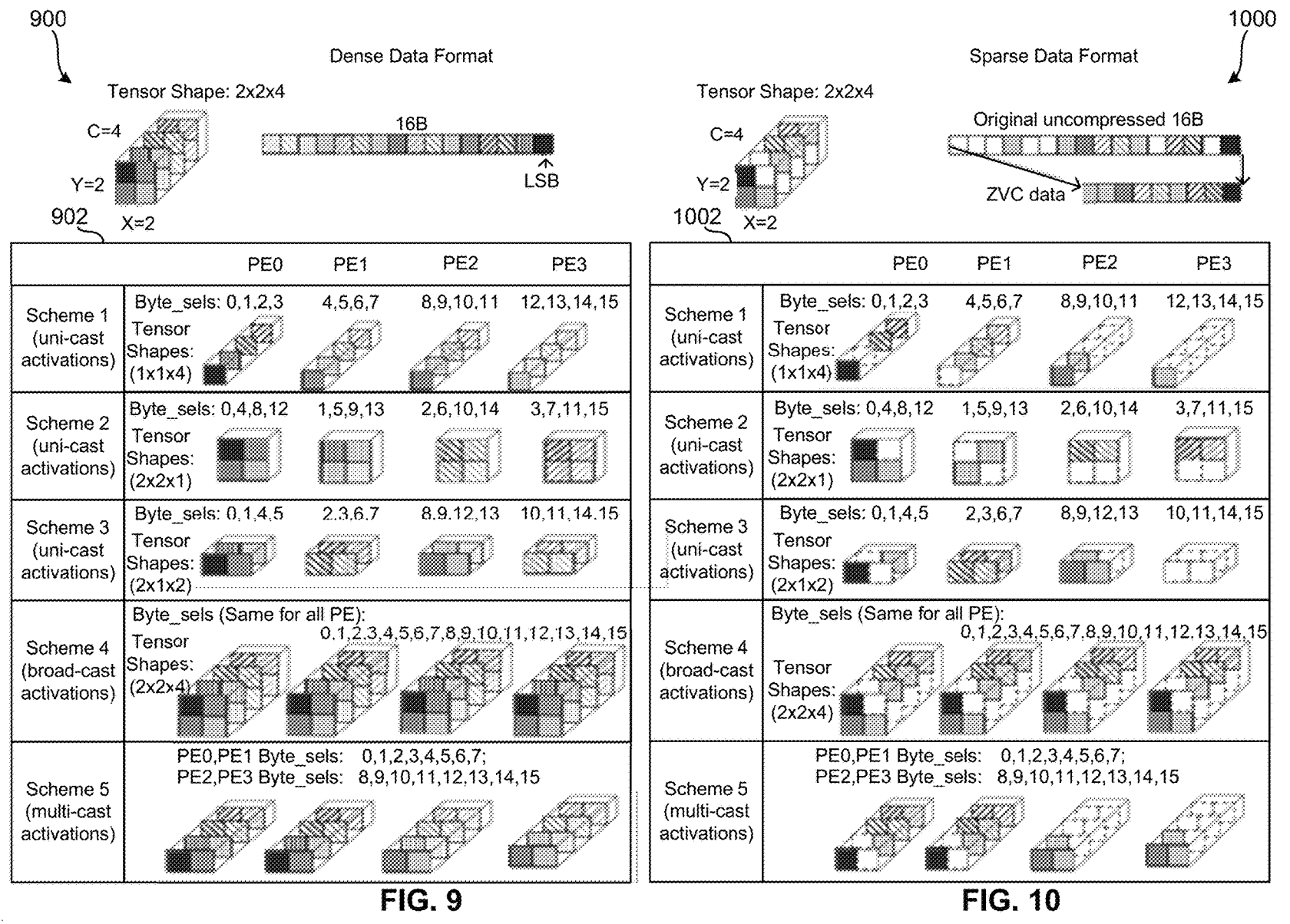

FIG. 9 is an example graphical illustration 900 showing multiple communication schemes 902 of uncompressed dense data in accordance with the teachings of this disclosure. The example of FIG. 9 illustrates flexible tensor data distribution in accordance with the example in-line sparsity-aware tensor data distribution (InSAD) system 100 disclosed herein. The example of FIG. 9 illustrates the dense data case (no zeros in the tensor volume), where different shading patterns show the different points in this tensor. For simplicity, the example of FIG. 9 illustrates four processing elements (PEs) (e.g. PE0, PE1, PE2, PE3) in one PE column that receives data in a X×Y×C dimension tensor data volume (where X=2, Y=2, and the channel number C=4). FIG. 9 illustrates a use case of the InSAD system 100 for five different schedules with different byte select signals. The example of FIG. 9 illustrates the dense data case (e.g., no zeros in the tensor volume, all bytes of the tensors are filled), where different shading patterns show the different points in this tensor.

In the illustrated example of FIG. 9, the multiple communication schemes 902 illustrate dense data distribution for five different programmed byte select signal values. For example, communication schemes 1-3 illustrate unicast cases in which each PE has different data points. Example scheme 4 illustrates a broadcast case in which all four PEs receive the same tensor data (e.g. same activations but different weights, where activations can be broadcasted). Example scheme 5 illustrates a multicast case in which some PEs receive the same tensor data. As shown in FIG. 9, the disclosed InSAD system 100 is flexible and handles multiple tensor shapes for dense uncompressed data.

FIG. 10 is a graphical illustration 1000 showing multiple communication schemes 1002 of zero-value-compression (ZVC) of sparse data (e.g., the original uncompressed 16 bytes) in accordance with the teachings of this disclosure. FIG. 10 illustrates flexible tensor data distribution in accordance with the example in-line sparsity-aware tensor data distribution (InSAD) system 100. For simplicity, the example of FIG. 10 illustrates four processing elements (PEs) (e.g. PE0, PE1, PE2, PE3) in one PE column that receives data in a X×Y×C tensor data volume (where X=2, Y=2, and the channel number C=4). Advantageously, the InSAD system 100 disclosed herein supports flexible tensor distribution by programming the byte select signals according to the scheduling information for a given DNN layer.

The graphical illustration 1000 illustrates a use case of the InSAD system 100 for five different schedules with different byte select signals. The example of FIG. 10 illustrates the sparse data case with ZVC, where the zero data is shown as empty blocks. As shown in FIG. 10, the disclosed InSAD system 100 is flexible and handles multiple tensor shapes for ZVC data.

FIGS. 9 and 10 illustrate five example distribution schemes including (1) unicast data of different tensor shapes (scheme 1-3), (2) broadcast data (scheme 4), and (3) multicast data (scheme 5). Because the byte select signals programmed by the configuration descriptors of the configuration description controller 110 are unaware of the sparsity in the data, the values of the byte select signals are the same between dense and sparse data, but different for different distribution schemes. As such, the disclosed InSAD system 100 is flexible and handles multiple tensor shapes and multiple data distribution schemes for uncompressed data and ZVC data.

Figure 11:
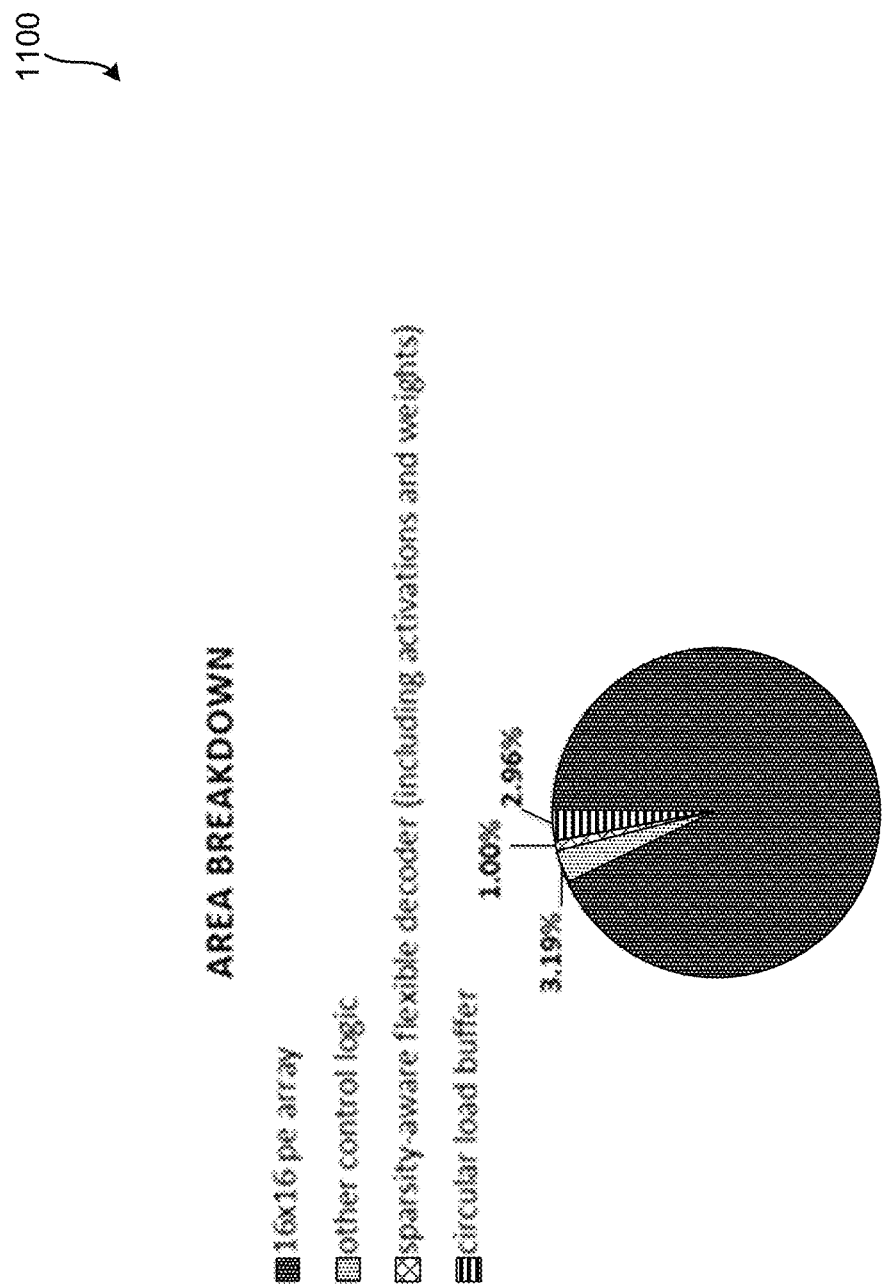
FIG. 11 is a graphical illustration showing example area consumption of the in-line sparsity-aware tensor data distribution system in accordance with the teachings of this disclosure.

FIG. 11 is an example graphical illustration 1100 showing the area consumption of the in-line sparsity-aware tensor data distribution (InSAD) system 100 in accordance with the teachings of this disclosure. The graphical illustration 1100 illustrates the area cost of the InSAD system 100. For example, the InSAD system 100 can be implemented in an SRAM buffer and load/store state machine of a processing platform. For 16×16 PE array (n=16, m=16), the input buffers occupy 2.5 kilobytes (kB) for activation and weights, respectively. The registers per PE occupy 384 bytes and the PEs occupy 96 KB for 256 PEs.

In the illustrated example of FIG. 11, the input buffers and sparse decoders for both activations and weights consume 2.96% and 1% of total area of the InSAD system 100, respectively. Other control logic consumes 3.19% of the total area of the InSAD system 100. As a result, the input buffer entries can be further reduced based on the memory latency. The overall design overhead (e.g., the input buffers, the sparse decoders, and the other control logic) is only 7.15% leaving 92.85% for the overall accelerator.

The example InSAD system 100 disclosed herein is a low-cost (3.96% area of the total PE array without SRAM area included) programmable hardware solution which can enable schedule dependent compressed data distribution in the DNN accelerators. The disclosed InSAD system 100 advantageously (1) does not require additional storage to hold uncompressed data during the tensor data distribution and (2) supports sparsity bitmap reconstruction for each PE during the load phase. Additionally, when implementing the disclosed InSAD system 100, programming of the byte select signals does not have sparsity dependency. Instead when implementing the disclosed InSAD system 100, programming of the byte select signals depends on the tensor shape provided by the compiler. The disclosed InSAD system 100 supports different tensor shapes to be processed in each PE. Because no zero data is written through the memory hierarchy during load, the data movement energy is significantly reduced with sparsity.

While an example manner of implementing the in-line sparsity-aware tensor data distribution (InSAD) system 100 of FIG. 1 is illustrated in FIGS. 2-11 and example manner of implementing ones of the first processing element (PE) 126, the second PE 128, and the nth PE 130 is illustrated in FIG. 3 as the example PE 300, one or more of the elements, processes and/or devices illustrated in FIGS. 2-11 may be combined, divided, re-arranged, omitted, eliminated and/or implemented in any other way. Further, the example first schedule-aware sparse distribution controller 102*a*, the example second schedule-aware sparse distribution controller 102*b*, the example mth schedule-aware sparse distribution controller 102*m*, the example memory routing controller 104, the example global memory 106, the example software compiler 108, the example configuration description controller 110, the example first input buffer 112, the example first sparse decoder 114, the example first multiplexer array 116, the example first PE column 118, the example first multiplexer 120, the example second multiplexer 122, the example nth multiplexer 124, the example first PE 126, the example second PE 128, the example nth PE 130, and/or, more generally, the example InSAD system 100 of FIG. 1, and/or the example buffer monitor 208, the example data controller 210, the example write controller 212, the example pointer controller 214, and/or, more generally, the example first sparse decoder 114, and/or the example activation transmission gate 302, the example activation register 304, the example activation sparsity bitmap register 306, the example weight transmission gate 308, the example weight register 310, the example weight sparsity bitmap register 312, the example logic processor 314, the example partial sum register 316, the example multiplier 318, the example adder 320, and/or, more generally, the example PE 300 may be implemented by hardware, software, firmware and/or any combination of hardware, software and/or firmware.

Thus, for example, any of the example first schedule-aware sparse distribution controller 102*a*, the example second schedule-aware sparse distribution controller 102*b*, the example mth schedule-aware sparse distribution controller 102*m*, the example memory routing controller 104, the example global memory 106, the example software compiler 108, the example configuration description controller 110, the example first input buffer 112, the example first sparse decoder 114, the example first multiplexer array 116, the example first PE column 118, the example first multiplexer 120, the example second multiplexer 122, the example nth multiplexer 124, the example first PE 126, the example second PE 128, the example nth PE 130, and/or, more generally, the example InSAD system 100 of FIG. 1, and/or the example buffer monitor 208, the example data controller 210, the example write controller 212, the example pointer controller 214, and/or, more generally, the example first sparse decoder 114, and/or the example activation transmission gate 302, the example activation register 304, the example activation sparsity bitmap register 306, the example weight transmission gate 308, the example weight register 310, the example weight sparsity bitmap register 312, the example logic processor 314, the example partial sum register 316, the example multiplier 318, the example adder 320, and/or, more generally, the example PE 300 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

When reading any of the apparatus or system claims of this patent to cover a purely software and/or firmware implementation, at least one of the example first schedule-aware sparse distribution controller 102*a*, the example second schedule-aware sparse distribution controller 102*b*, the example mth schedule-aware sparse distribution controller 102*m*, the example memory routing controller 104, the example global memory 106, the example software compiler 108, the example configuration description controller 110, the example first input buffer 112, the example first sparse decoder 114, the example first multiplexer array 116, the example first PE column 118, the example first multiplexer 120, the example second multiplexer 122, the example nth multiplexer 124, the example first PE 126, the example second PE 128, the example nth PE 130, and/or, more generally, the example InSAD system 100 of FIG. 1, and/or the example buffer monitor 208, the example data controller 210, the example write controller 212, the example pointer controller 214, and/or, more generally, the example first sparse decoder 114, and/or the example activation transmission gate 302, the example activation register 304, the example activation sparsity bitmap 306, the example weight transmission gate 308, the example weight register 310, the example weight sparsity bitmap 312, the example logic processor 314, the example partial sum register 316, the example multiplier 318, the example adder 320, and/or, more generally, the example PE 300 is/are hereby expressly defined to include a non-transitory computer readable storage device or storage disk such as a memory, a digital versatile disk (DVD), a compact disk (CD), a Blu-ray disk, etc. including the software and/or firmware. Further still, the example InSAD system 100, the example first sparse decoder 114, and/or the example PE 300 of FIG. 1, FIG. 2, and/or FIG. 3 may include one or more elements, processes and/or devices in addition to, or instead of, those illustrated in FIGS. 1-11, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 13:
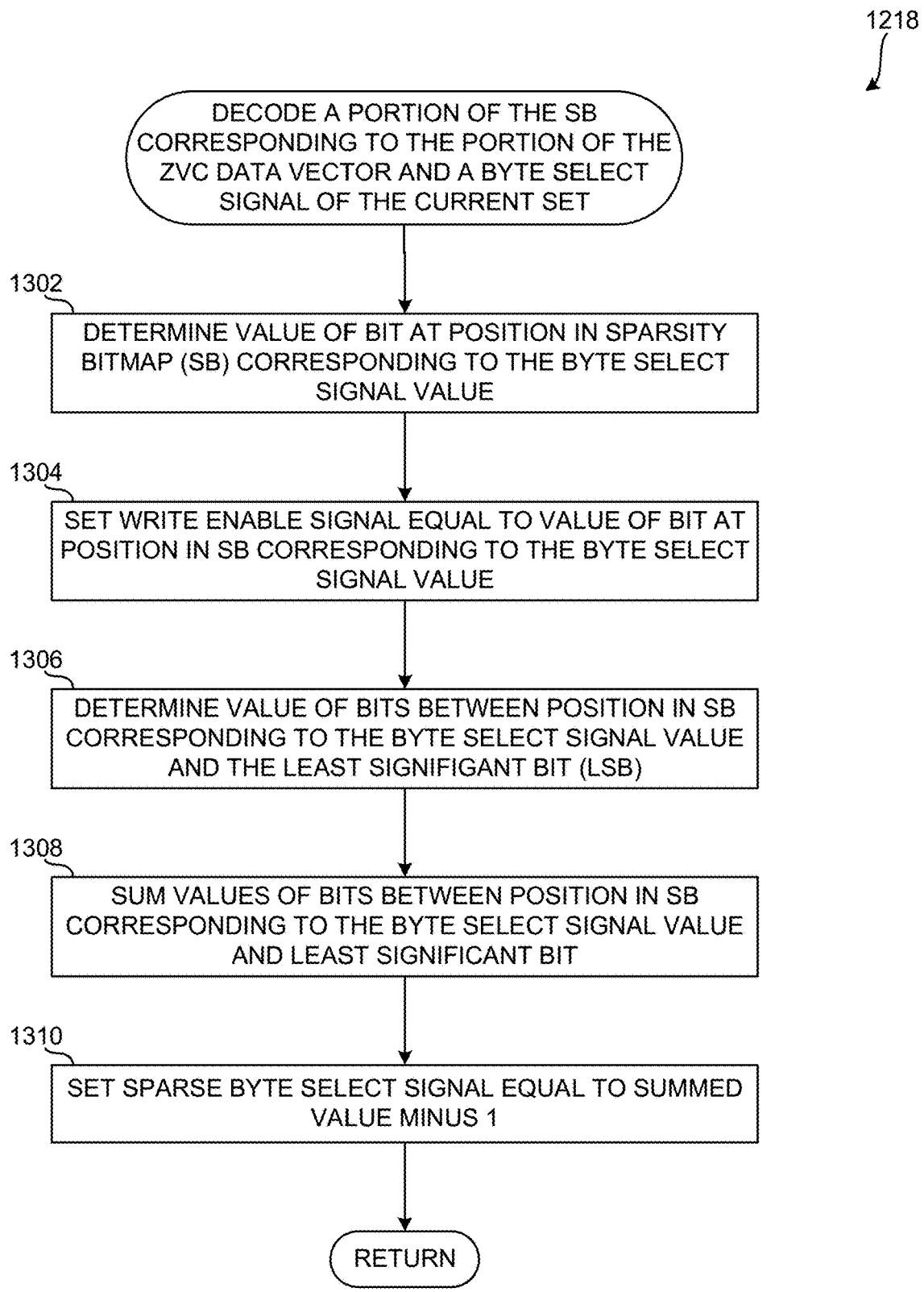
FIG. 13 is a flowchart representative of an example process, which may be implemented utilizing machine-readable instructions that may be executed, to implement the example first sparse decoder of FIGS. 1 and 2.
Figure 14:
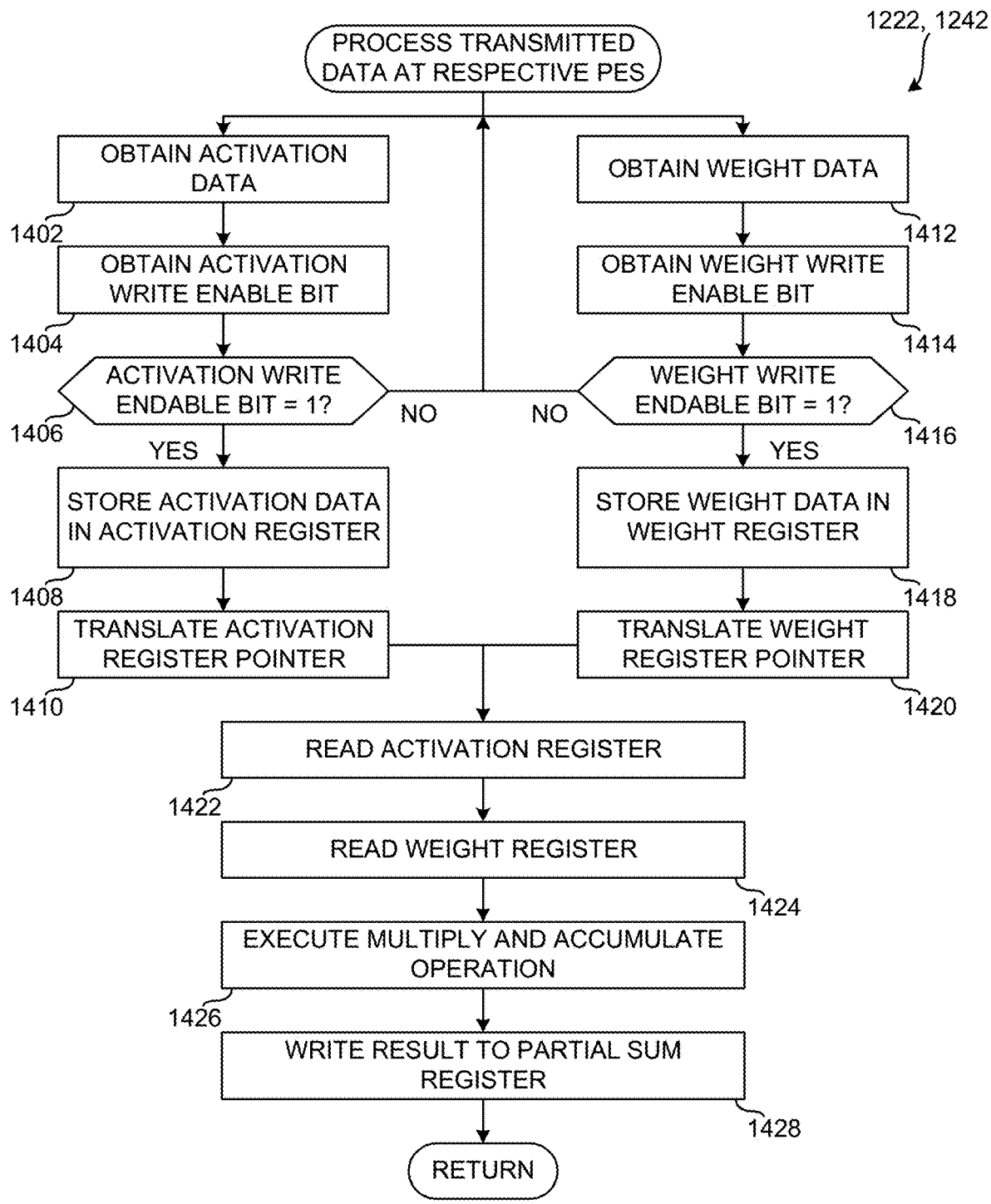
FIG. 14 is a flowchart representative of an example process, which may be implemented utilizing machine-readable instructions that may be executed, to implement the example processing element of FIG. 3.

Flowcharts representative of example hardware logic, machine-readable instructions, hardware implemented state machines, and/or any combination thereof for implementing the example InSAD system 100 of FIG. 1, the example first sparse decoder 114, and the example PE 300 are shown in FIGS. 12, 13, and 14. The machine-readable instructions may be one or more executable programs or portion(s) of an executable program for execution by a computer processor such as the processor 1512 shown in the example processor platform 1500 discussed below in connection with FIG. 15. The program may be embodied in software stored on a non-transitory computer readable storage medium such as a CD-ROM, a floppy disk, a hard drive, a DVD, a Blu-ray disk, or a memory associated with the processor 1512, but the entire program and/or parts thereof could alternatively be executed by a device other than the processor 1512 and/or embodied in firmware or dedicated hardware. Further, although the example program is described with reference to the flowcharts illustrated in FIGS. 12, 13, and 14, many other methods of implementing the example InSAD system 100, the example first sparse decoder 114, and/or the example PE 300 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine-readable instructions described herein may be stored in one or more of a compressed format, an encrypted format, a fragmented format, a compiled format, an executable format, a packaged format, etc. Machine-readable instructions as described herein may be stored as data (e.g., portions of instructions, code, representations of code, etc.) that may be utilized to create, manufacture, and/or produce machine executable instructions. For example, the machine-readable instructions may be fragmented and stored on one or more storage devices and/or computing devices (e.g., servers). The machine-readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine-readable instructions may be stored in multiple parts, which are individually compressed, encrypted, and stored on separate computing devices, wherein the parts when decrypted, decompressed, and combined form a set of executable instructions that implement a program such as that described herein.

In another example, the machine-readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, the disclosed machine-readable instructions and/or corresponding program(s) are intended to encompass such machine-readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 12, 13, and 14 may be implemented using executable instructions (e.g., computer and/or machine-readable instructions) stored on a non-transitory computer and/or machine-readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 12 is a flowchart representative of a process 1200, which may be implemented utilizing machine-readable instructions that may be executed, to implement the example in-line sparsity-aware tensor data distribution (InSAD) system 100 of FIG. 1. The process 1200 begins at block 1202 where the first sparse decoder 114 monitors the input buffer. For example, at block 1202, the buffer monitor 208 monitors the first input buffer 112.

In the illustrated example of FIG. 12, at block 1204 the first sparse decoder 114 determines whether a header has been detected in the input buffer. For example, at block 1204, the buffer monitor 208 determines whether a header has been detected in the first input buffer 112. In response to the example buffer monitor 208 determining and/or otherwise detecting no header (block 1204: NO), the process 1200 returns to block 1202. In response to the example buffer monitor 208 determining and/or otherwise detecting a header (block 1204: YES), the process 1200 proceeds to block 1206. At block 1206, the first sparse decoder 114 translates the pointer of the first sparse decoder 114 and the pointer of the first multiplexer array 116 one byte in the input buffer. For example, at block 1206, the pointer controller 214 translates the pointer of the first sparse decoder 114 and the pointer of the first multiplexer array 116 one byte in the first input buffer 112.

In the illustrated example of FIG. 12, at block 1208 the first sparse decoder 114 reads a first set of byte select signals from the configuration description controller (CDC) (e.g., the configuration description controller 110). At block 1210, the first sparse decoder 114 determines whether the header indicates that data following the header is compressed. For example, at block 1210, the buffer monitor 208 determines whether the header indicates that data following the header is compressed based on searching for and/or otherwise detecting a specific header value (e.g., the header≠0xff). In response to the header indicating that data following the header is compressed (block 1210: YES), the process 1200 proceeds to block 1212. At block 1212, the first sparse decoder 114 reads the sparsity bitmap (SB) from the input buffer. For example, at block 1212, the buffer monitor 208 reads the sparsity bitmap from the first input buffer 112.

In the illustrated example of FIG. 12, at block 1214 the first sparse decoder 114 translates the pointer of the first multiplexer array 116 a number of bits in the input buffer that is equal to the length of the sparsity bitmap. For example, at block 1214, the pointer controller 214 translates the pointer of the first multiplexer array 116 a number of bits in the input buffer that is equal to the length of the sparsity bitmap. At block 1216, the first multiplexer array 116 reads a first portion of a zero-value-compression (ZVC) data vector from the first input buffer 112. For example, the first portion of the ZVC data vector can correspond to 16 bytes of the ZVC data vector.

In the illustrated example of FIG. 12, at block 1218 the first sparse decoder 114 decodes a portion of the sparsity bitmap. In examples disclosed herein, the portion of the sparsity bitmap decoded by the first sparse decoder 114 corresponds to the first portion of the ZVC data vector read by the first multiplexer array 116 and a first one of the first set of byte select signals received from the configuration description controller 110. Detailed example machine-readable instructions to decode a portion of the sparsity bitmap are illustrated and described in connection with FIG. 13.

In the illustrated example of FIG. 12, at block 1220 the first multiplexer array 116 transmits data from the portion of the ZVC data vector to a corresponding PE based on the sparse byte select signal generated by the first sparse decoder 114 (e.g., the first PE 126 for the first sparse byte select signal Sparse_Byte_Sel[0]). At block 1222, the PE 300 process the transmitted data at the respective PE. Detailed example machine-readable instructions to process the transmitted data at the respective PE are illustrated and described in connection with FIG. 14.

In the illustrated example of FIG. 12, at block 1224 the first sparse decoder 114 determines whether there are additional byte select signals to process in the first set of byte select signals. If there are additional byte select signals in the first set of byte select signals (block 1224: YES), the example process 1200 proceeds to block 1218. If there are not additional byte select signals in the first set of byte select signals (block 1224: NO), the process 1200 proceeds to block 1226. At block 1226, the first sparse decoder 114 determines whether there are any additional portions of the ZVC data vector in the input buffer. For example, at block 1226, the buffer monitor 208 determines whether there are any additional portions of the ZVC data vector in the first input buffer 112.

In the illustrated example of FIG. 12, if there are no additional portions of the ZVC data vector in the first input buffer 112 (block 1226: NO), the process 1200 proceeds to block 1202. If there are additional portions of the ZVC data vector in the first input buffer 112 (block 1226: YES), the process 1200 proceeds to block 1228. At block 1228, the first sparse decoder 114 translates the decoder pointer a number of bits in the input buffer equal to the portion of the sparsity bitmap. For example, at block 1228, the pointer controller 214 translates the decoder pointer a number of bits in the input buffer equal to the portion of the sparsity bitmap. For example, the pointer controller 214 translates the pointer of the first sparse decoder 114 a number of bits in the first input buffer 112 equal to the sum of ones in the current portion of the sparsity bitmap. In examples disclosed herein, the number of cycles for decoding a portion of the sparsity bitmap depends on the data distribution scheme specified by the schedule (e.g., particular tensor shape(s), improved instruction-level parallelism, etc.). For broadcast cases, the same data can be distributed to different PEs in a column, thus the portion of the sparsity bitmap is accessed 16 times. For unicast cases, all PEs utilize unique data, thus the portion of the sparsity bitmap is decoded once for parallel access by each PE. Once the current portion of the sparsity bitmap is decoded for each PE, the next portion of the sparsity bitmap is selected.

In the illustrated example of FIG. 12, at block 1230 the first sparse decoder 114 reads an additional set of byte select signals from the configuration description controller 110 (e.g., the CDC). At block 1232, the first sparse decoder 114 translates the pointer of the first multiplexer array 116 a number of bits in the input buffer equal to the portion of the ZVC data vector. For example, at block 1232, the pointer controller 214 translates the pointer of the first multiplexer array 116 a number of bits in the first input buffer 112 equal to the portion of the ZVC data vector. After block 1232, the process 1200 proceeds to block 1216.

Returning to block 1210, in response to the header indicating that data following the header is not compressed (block 1210: NO), the process 1200 proceeds to block 1234. At block 1234, the first multiplexer array 116 reads a first portion of a dense vector from the first input buffer 112. For example, the first portion of the dense vector can correspond to 16 bytes of the dense vector. At block 1236, the first sparse decoder 114 sets the write enable signal for a given PE to be equal to one. For example, at block 1236, the write controller 212 sets the write enable signal for a given PE signal equal to one.

In the illustrated example of FIG. 12, at block 1238 the first sparse decoder 114 sets the sparse byte select signal for a given PE equal to the byte select signal for the given PE. For example, at block 1238, the data controller 210 sets the sparse byte select signal for a given PE equal to the byte select signal for the given PE. At block 1240, the first multiplexer array 116 transmits data from the portion of the dense vector to a corresponding PE based on the sparse byte select signal generated by the first sparse decoder 114 (e.g., the first PE 126 for the first sparse byte select signal Sparse_Byte_Sel[0]). At block 1242, the PE 300 process the transmitted data at the respective PE. Detailed example machine-readable instructions to process the transmitted data at the respective PE are illustrated and described in connection with FIG. 14.

In the illustrated example of FIG. 12, at block 1244 the first sparse decoder 114 determines whether there are additional byte select signals to process in the first set of byte select signals. If there are additional byte select signals in the first set of byte select signals (block 1244: YES), the process 1200 proceeds to block 1236. If there are not additional byte select signals in the first set of byte select signals (block 1244: NO), the process 1200 proceeds to block 1246. At block 1246, the first sparse decoder 114 determines whether there are any additional portions of the dense vector in the input buffer. For example, at block 1246, the buffer monitor 208 determines whether there are any additional portions of the dense vector in the first input buffer 112.

In the illustrated example of FIG. 12, if there are no additional portions of the dense vector in the first input buffer 112 (block 1246: NO), the process 1200 proceeds to block 1202. If there are additional portions of the dense vector in the first input buffer 112 (block 1246: YES), the process 1200 proceeds to block 1248. At block 1248, the first sparse decoder 114 reads an additional set of byte select signals from the configuration description controller 110 (e.g., the CDC). At block 1250, the first sparse decoder 114 translates the pointer of the first multiplexer array 116 a number of bits in the input buffer equal to the portion of the dense vector. For example, at block 1250, the pointer controller 214 translates the pointer of the first multiplexer array 116 a number of bits in the first input buffer 112 equal to the portion of the dense vector. After block 1250, the process 1200 proceeds to block 1234.

FIG. 13 is a flowchart representative of a process 1218, which may be implemented utilizing machine-readable instructions that may be executed, to implement the example first sparse decoder 114 of FIGS. 1 and 2. The process 1218 begins at block 1302 where the first sparse decoder 114 determines the value of the bit at a position in the sparsity bitmap corresponding to the value of the byte select signal. For example, at block 1302, the write controller 212 determines the value of a bit at a position in the sparsity bitmap corresponding to the value of the byte select signal for a given PE (e.g., Byte_Sel[0] for the first PE 126).

In the illustrated example of FIG. 13, at block 1304 the first sparse decoder 114 sets the write enable signal for a given PE equal to the value of the bit at the position in the sparsity bitmap corresponding to the value of the byte select signal. For example, at block 1304, based on the value of the byte select signal for the given PE, the write controller 212 sets the write enable signal for the given PE (e.g., Write_en [0]) equal to the value of the bit at the position in the sparsity bitmap corresponding to the value of the byte select signal (e.g., Byte_Sel[0]).

In the illustrated example of FIG. 13, at block 1306 the first sparse decoder 114 determines the value of the bits between (a) the position in the sparsity bitmap corresponding to the value of the byte select signal and (b) the least significant bit (LSB) of the sparsity bitmap. For example, at block 1306, the data controller 210 determines the value of the bits between (a) the position in the sparsity bitmap corresponding to the value of the byte select signal for a given PE (e.g., Byte_Sel[0] for the first PE 126) and (b) the LSB of the sparsity bitmap. At block 1308, the first sparse decoder 114 sums the values of the bits between (a) the position in the sparsity bitmap corresponding to the value of the byte select signal for a given PE (e.g., Byte_Sel[0] for the first PE 126) and (b) the LSB of the sparsity bitmap. For example, at block 1308, the data controller 210 sums the values of the bits between (a) the position in the sparsity bitmap corresponding to the value of the byte select signal for a given PE (e.g., Byte_Sel[0] for the first PE 126) and (b) the LSB of the sparsity bitmap.

In the illustrated example of FIG. 13, at block 1310 the first sparse decoder 114 sets the sparse byte select signal for the given PE (e.g., Sparse_Byte_Sel[0] for the first PE 126) equal to the summed value minus one. For example, at block 1310, the data controller 210 sets the sparse byte select signal for the given PE (e.g., Sparse_Byte_Sel[0] for the first PE 126) equal to the summed value minus one. After block 1310, the process 1218 return to the process 1200 at block 1220.

FIG. 14 is a flowchart representative of a process 1222 and/or a process 1242, which may be implemented utilizing machine-readable instructions that may be executed, to implement the example processing element (PE) 300 of FIG. 3. The process 1222 and/or the process 1242 begins at block 1402 and block 1412. For example, the PE 300 can execute block 1402 and block 1412 via parallel processing techniques. At block 1402 where the PE 300 obtains activation data. For example, at block 1402, the activation transmission gate 302 obtains activation data. At block 1404, the PE 300 obtains an activation write enable bit. For example, at block 1404, the activation transmission gate 302 obtains an activation write enable bit.

In the illustrated example of FIG. 14, at block 1406 the PE 300 determines whether the activation write enable bit equals one (e.g., is valid). For example, at block 1406, the activation transmission gate 302 determines whether the activation write enable bit equals one. In response to the activation write enable bit not being equal to one (block 1406: NO), the process 1222 and/or the process 1242 proceeds to block 1402 and/or block 1412. In response to the activation write enable bit being equal to one (block 1406: YES), the process 1222 and/or the process 1242 proceeds to block 1408.

In the illustrated example of FIG. 14, at block 1408 the PE 300 stores the activation data in the activation register 304. For example, at block 1408, the activation register 304 stores the activation data. At block 1410, the PE 300 translates the pointer of the activation register 304 one byte. For example, at block 1410, the activation register 304 translates the pointer of the activation register 304 one byte. After block 1410, the process 1222 and/or the process 1242 proceeds to block 1422.

In the illustrated example of FIG. 14, at block 1412 the PE 300 obtains weight data. For example, at block 1412, the weight transmission gate 308 obtains weight data. At block 1414, the PE 300 obtains a weight write enable bit. For example, at block 1414, the weight transmission gate 308 obtains a weight write enable bit.

In the illustrated example of FIG. 14, at block 1416 the PE 300 determines whether the weight write enable bit equals one (e.g., is valid). For example, at block 1416, the weight transmission gate 308 determines whether the weight write enable bit equals one. In response to the weight write enable bit not being equal to one (block 1416: NO), the process 1222 and/or the process 1242 proceeds to block 1402 and/or block 1412. In response to the weight write enable bit being equal to one (block 1416: YES), the process 1222 and/or the process 1242 proceeds to block 1418.

In the illustrated example of FIG. 14, at block 1418 the PE 300 stores the weight data in the weight register 310. For example, at block 1418, the weight register 310 stores the weight data. At block 1420, the PE 300 translates the pointer of the weight register 310 one byte. For example, at block 1420, the weight register 310 translates the pointer of the weight register 310 one byte. After block 1420, the process 1222 and/or the process 1242 proceeds to block 1422.

In the illustrated example of FIG. 14, at block 1422 the logic processor 314, and/or, more generally, the PE 300 reads the data in the activation register 304. For example, at block 1422, the multiplier 318 reads the data in the activation register 304. At block 1424, the logic processor 314, and/or, more generally, the PE 300 reads the data in the weight register 310. For example, at block 1424, the multiplier 318 reads the data in the weight register 310. At block 1426, the PE 300 executes the multiply and accumulate operation on the data stored in the activation register 304 and/or the weight register 310. For example, at block 1426, the logic processor 314 executes the multiply and accumulate operation on the data stored in the activation register 304 and/or the weight register 310.

In the illustrated example of FIG. 14, at block 1428 the PE 300 writes the result of the multiply and accumulate operation to the partial sum register 316. For example, at block 1428, the adder 320 writes the result of the multiply and accumulate operation to the partial sum register 316. After block 1428, the process 1222 and/or the process 1242 return to the process 1200 at block 1224 and block 1244, respectively.

FIG. 15 is a block diagram of an example processor platform 1500 structured to execute the instructions of FIGS. 12, 13, and 14 to implement the example in-line sparsity-aware tensor data distribution (InSAD) system 100 of FIG. 1, the first sparse decoder 114 of FIG. 2, and/or the PE 300 of FIG. 3. The processor platform 1500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1500 of the illustrated example includes a processor 1512. The processor 1512 of the illustrated example is hardware. For example, the processor 1512 can be implemented by one or more integrated circuits, logic circuits, microprocessors, GPUs, DSPs, or controllers from any desired family or manufacturer. The hardware processor 1512 may be a semiconductor based (e.g., silicon based) device. In this example, the processor 1512 implements the example first schedule-aware sparse distribution controller 102a, the example second schedule-aware sparse distribution controller 102b, the example mth schedule-aware sparse distribution controller 102m, the example memory routing controller 104, the example global memory 106, the example software compiler 108, the example configuration description controller 110, the example first input buffer 112, the example first sparse decoder 114, the example first multiplexer array 116, the example first PE column 118, the example first multiplexer 120, the example second multiplexer 122, the example nth multiplexer 124, the example first PE 126, the example second PE 128, the example nth PE 130, and/or, more generally, the example InSAD system 100 of FIG. 1, and/or the example buffer monitor 208, the example data controller 210, the example write controller 212, the example pointer controller 214, and/or, more generally, the example first sparse decoder 114, and/or the example activation transmission gate 302, the example activation register 304, the example activation sparsity bitmap register 306, the example weight transmission gate 308, the example weight register 310, the example weight sparsity bitmap register 312, the example logic processor 314, the example partial sum register 316, the example multiplier 318, the example adder 320, and/or, more generally, the example PE 300.

The processor 1512 of the illustrated example includes a local memory 1513 (e.g., a cache). The processor 1512 of the illustrated example is in communication with a main memory including a volatile memory 1514 and a non-volatile memory 1516 via a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1516 may be implemented by flash memory and/or any other desired type of memory device. Access to the main memory 1514, 1516 is controlled by a memory controller.

The processor platform 1500 of the illustrated example also includes an interface circuit 1520. The interface circuit 1520 may be implemented by any type of interface standard, such as an Ethernet interface, a universal serial bus (USB), a Bluetooth® interface, a near field communication (NFC) interface, and/or a PCI express interface.

In the illustrated example, one or more input devices 1522 are connected to the interface circuit 1520. The input device(s) 1522 permit(s) a user to enter data and/or commands into the processor 1512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1524 are also connected to the interface circuit 1520 of the illustrated example. The output devices 1524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1520 of the illustrated example, thus, typically includes a graphics driver card, a graphics driver chip and/or a graphics driver processor.

The interface circuit 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1500 of the illustrated example also includes one or more mass storage devices 1528 for storing software and/or data. Examples of such mass storage devices 1528 include floppy disk drives, hard drive disks, compact disk drives, Blu-ray disk drives, redundant array of independent disks (RAID) systems, and digital versatile disk (DVD) drives.

The machine executable instructions 1532 of FIGS. 12, 13, and 14 may be stored in the mass storage device 1528, in the volatile memory 1514, in the non-volatile memory 1516, and/or on a removable non-transitory computer readable storage medium such as a CD or DVD.

From the foregoing, it will be appreciated that example methods, apparatus and articles of manufacture have been disclosed that decode zero-value-compression data vectors in machine learning accelerators. Examples disclosed herein advantageously do not require staging buffers for uncompressed data (e.g., sparse vectors). Examples disclosed herein do not require movement of zero elements through on-chip memory hierarchy. The disclosed methods, apparatus, and articles of manufacture advantageously increase local register file utilization and decrease data movement energy consumption by storing non-zero elements as opposed to zero elements and non-zero elements.

Advantageously, example disclosed methods, apparatus, and articles of manufacture reconstruct the sparsity bitmap at PEs on the fly according to the flexible tensor shapes. For example, disclosed methods, apparatus, and articles of manufacture regenerate the sparsity bitmap at each PE based on its distributed tensor volume. Advantageously, examples disclosed herein support flexible tensor distribution by programming the byte select signals according to the scheduling information for a given DNN layer. Disclosed methods, apparatus, and articles of manufacture provide programmable flexible tensor data distribution capability to support different schedules in terms of convolution loop partitioning and loop blocking (e.g. weight-stationary, activation stationary, partial sum-stationary, etc.).

Disclosed methods, apparatus and articles of manufacture improve the efficiency of using a computing device by reducing on-chip storage overhead for decompressed data after sparsity decoding. Disclosed methods, apparatus, and articles of manufacture advantageously (1) do not require additional storage to hold uncompressed data during the tensor data distribution and (2) support sparsity bitmap reconstruction for each PE during the load phase. Additionally, when implementing example disclosed methods, apparatus, and articles of manufacture, programming of the byte select signals does not include sparsity dependency. Instead when implementing example methods, apparatus, and articles of manufacture, programming of the byte select signals depends on the tensor shape provided by the compiler via the schedule.

Examples disclosed herein support different tensor shapes to be processed in each PE. Because no zero data is written through the memory hierarchy during load, the data movement energy is significantly reduced with sparsity. Examples disclosed herein enable energy efficient DNN accelerators which are a critical part of edge inferences for various AI applications including imaging, video and speech applications. Examples disclosed herein improve energy efficiency, performance, and advantageously leverage transistor scaling. Examples disclosed herein enable efficient processing of sparse data which is essential to deliver improved energy efficiency for modern AI workloads. The disclosed methods, apparatus and articles of manufacture are accordingly directed to one or more improvement(s) in the functioning of a computer.

Example methods, apparatus, systems, and articles of manufacture to decode zero-value-compression data vectors are disclosed herein. Further examples and combinations thereof include the following:

Example 1 includes an apparatus comprising a buffer monitor to monitor a buffer for a header including a value indicative of compressed data, a data controller to, when the buffer includes compressed data, determine a first value of a sparse select signal based on (1) a select signal and (2) a first position in a sparsity bitmap, the first value of the sparse select signal corresponding to a processing element that is to process a portion of the compressed data, and a write controller to, when the buffer includes compressed data, determine a second value of a write enable signal based on (1) the select signal and (2) a second position in the sparsity bitmap, the second value of the write enable signal corresponding to the processing element that is to process the portion of the compressed data.

Example 2 includes the apparatus of example 1, wherein the data controller is to sum values of bits in the sparsity bitmap between the first position in the sparsity bitmap and a third position in the sparsity bitmap, the first position corresponding to a value of the select signal, the third position corresponding to a least significant bit of the sparsity bitmap, and set the first value of the sparse select signal equal to the sum minus one.

Example 3 includes the apparatus of example 1, wherein the data controller is to cause a multiplexer to transmit data to the processing element based on the first value of the sparse select signal.

Example 4 includes the apparatus of example 1, wherein the write controller is to set the second value of the write enable signal equal to a value of a bit at the second position in the sparsity bitmap, the second position corresponding to a value of the select signal.

Example 5 includes the apparatus of example 1, wherein the write controller is to cause the processing element to process data from a multiplexer based on the second value of the write enable signal.

Example 6 includes the apparatus of example 1, wherein the write controller is to cause, via transmission of the write enable signal, the sparsity bitmap to be reconstructed at the processing element.

Example 7 includes the apparatus of example 1, wherein the value indicative of compressed data indicates that data following the header includes the sparsity bitmap and a zero-value-compression data vector.

Example 8 includes a non-transitory computer readable storage medium comprising instructions which, when executed, cause at least one processor to at least monitor a buffer for a header including a value indicative of compressed data, when the buffer includes compressed data, determine a first value of a sparse select signal based on (1) a select signal and (2) a first position in a sparsity bitmap, the first value of the sparse select signal corresponding to a processing element that is to process a portion of the compressed data, and when the buffer includes compressed data, determine a second value of a write enable signal based on (1) the select signal and (2) a second position in the sparsity bitmap, the second value of the write enable signal corresponding to the processing element that is to process the portion of the compressed data.

Example 9 includes the non-transitory computer readable storage medium of example 8, wherein the instructions, when executed, cause the at least one processor to sum values of bits in the sparsity bitmap between the first position in the sparsity bitmap and a third position in the sparsity bitmap, the first position corresponding to a value of the select signal, the third position corresponding to a least significant bit of the sparsity bitmap, and set the first value of the sparse select signal equal to the sum minus one.

Example 10 includes the non-transitory computer readable storage medium of example 8, wherein the instructions, when executed, cause the at least one processor to cause a multiplexer to transmit data to the processing element based on the first value of the sparse select signal.

Example 11 includes the non-transitory computer readable storage medium of example 8, wherein the instructions, when executed, cause the at least one processor to set the second value of the write enable signal equal to a value of a bit at the second position in the sparsity bitmap, the second position corresponding to a value of the select signal.

Example 12 includes the non-transitory computer readable storage medium of example 8, wherein the instructions, when executed, cause the at least one processor to cause the processing element to process data from a multiplexer based on the second value of the write enable signal.

Example 13 includes the non-transitory computer readable storage medium of example 8, wherein the instructions, when executed, cause, via transmission of the write enable signal, the sparsity bitmap to be reconstructed at the processing element.

Example 14 includes the non-transitory computer readable storage medium of example 8, wherein the value indicative of compressed data indicates that data following the header includes the sparsity bitmap and a zero-value-compression data vector.

Example 15 includes an apparatus comprising means for monitoring to monitor a buffer for a header including a value indicative of compressed data, means for controlling data to, when the buffer includes compressed data, determine a first value of a sparse select signal based on (1) a select signal and (2) a first position in a sparsity bitmap, the first value of the sparse select signal corresponding to a processing element that is to process a portion of the compressed data, and means for controlling writing to, when the buffer includes compressed data, determine a second value of a write enable signal based on (1) the select signal and (2) a second position in the sparsity bitmap, the second value of the write enable signal corresponding to the processing element that is to process the portion of the compressed data.

Example 16 includes the apparatus of example 15, wherein the means for controlling data is to sum values of bits in the sparsity bitmap between the first position in the sparsity bitmap and a third position in the sparsity bitmap, the first position corresponding to a value of the select signal, the third position corresponding to a least significant bit of the sparsity bitmap, and set the first value of the sparse select signal equal to the sum minus one.

Example 17 includes the apparatus of example 15, wherein the means for controlling data is to cause a multiplexer to transmit data to the processing element based on the first value of the sparse select signal.

Example 18 includes the apparatus of example 15, wherein the means for controlling writing is to set the second value of the write enable signal equal to a value of a bit at the second position in the sparsity bitmap, the second position corresponding to a value of the select signal.

Example 19 includes the apparatus of example 15, wherein the means for controlling writing is to cause the processing element to process data from a multiplexer based on the second value of the write enable signal.

Example 20 includes the apparatus of example 15, wherein the means for controlling writing cause, via transmission of the write enable signal, the sparsity bitmap to be reconstructed at the processing element.

Example 21 includes the apparatus of example 15, wherein the value indicative of compressed data indicates that data following the header includes the sparsity bitmap and a zero-value-compression data vector.

Example 22 includes a method comprising monitoring, by executing an instruction with at least one processor, a buffer for a header including a value indicative of compressed data, when the buffer includes compressed data, determining, by executing an instruction with the at least one processor, a first value of a sparse select signal based on (1) a select signal and (2) a first position in a sparsity bitmap, the first value of the sparse select signal corresponding to a processing element that is to process a portion of the compressed data, and when the buffer includes compressed, determining, by executing an instruction with the at least one processor, a second value of a write enable signal based on (1) the select signal and (2) a second position in the sparsity bitmap, the second value of the write enable signal corresponding to the processing element that is to process the portion of the compressed data.

Example 23 includes the method of example 22, further including summing values of bits in the sparsity bitmap between the first position in the sparsity bitmap and a third position in the sparsity bitmap, the first position corresponding to a value of the select signal, the third position corresponding to a least significant bit of the sparsity bitmap, and setting the first value of the sparse select signal equal to the sum minus one.

Example 24 includes the method of example 22, further including causing a multiplexer to transmit data to the processing element based on the first value of the sparse select signal.

Example 25 includes the method of example 22, further including setting the second value of the write enable signal equal to a value of a bit at the second position in the sparsity bitmap, the second position corresponding to a value of the select signal.

Example 26 includes the method of example 22, further including causing the processing element to process data from a multiplexer based on the second value of the write enable signal.

Example 27 includes the method of example 22, further including causing, via transmission of the write enable signal, the sparsity bitmap to be reconstructed at the processing element.

Example 28 includes the method of example 22, wherein the value indicative of compressed data indicates that data following the header includes the sparsity bitmap and a zero-value-compression data vector.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:
    a buffer monitor to monitor a buffer for a header including a value indicative of compressed data;
    a data controller to, when the buffer includes compressed data, determine a first value of a sparse select signal based on (1) a select signal and (2) a first position in a sparsity bitmap, the first value of the sparse select signal corresponding to a processing element that is to process a portion of the compressed data; and
    a write controller to, when the buffer includes compressed data, determine a second value of a write enable signal based on (1) the select signal and (2) a second position in the sparsity bitmap, the second value of the write enable signal corresponding to the processing element that is to process the portion of the compressed data.

2. The apparatus of claim 1, wherein the data controller is to:
    sum values of bits in the sparsity bitmap between the first position in the sparsity bitmap and a third position in the sparsity bitmap, the first position corresponding to a value of the select signal, the third position corresponding to a least significant bit of the sparsity bitmap; and
    set the first value of the sparse select signal equal to the sum minus one.

3. The apparatus of claim 1, wherein the data controller is to cause a multiplexer to transmit data to the processing element based on the first value of the sparse select signal.

4. The apparatus of claim 1, wherein the write controller is to set the second value of the write enable signal equal to a value of a bit at the second position in the sparsity bitmap, the second position corresponding to a value of the select signal.

5. The apparatus of claim 1, wherein the write controller is to cause the processing element to process data from a multiplexer based on the second value of the write enable signal.

6. The apparatus of claim 1, wherein the write controller is to cause, via transmission of the write enable signal, the sparsity bitmap to be reconstructed at the processing element.

7. The apparatus of claim 1, wherein the value indicative of compressed data indicates that data following the header includes the sparsity bitmap and a zero-value-compression data vector.

8. A non-transitory computer readable storage medium comprising instructions which, when executed, cause at least one processor to at least:
    monitor a buffer for a header including a value indicative of compressed data;
    when the buffer includes compressed data, determine a first value of a sparse select signal based on (1) a select signal and (2) a first position in a sparsity bitmap, the first value of the sparse select signal corresponding to a processing element that is to process a portion of the compressed data; and
    when the buffer includes compressed data, determine a second value of a write enable signal based on (1) the select signal and (2) a second position in the sparsity bitmap, the second value of the write enable signal corresponding to the processing element that is to process the portion of the compressed data.

9. The non-transitory computer readable storage medium of claim 8, wherein the instructions, when executed, cause the at least one processor to:
    sum values of bits in the sparsity bitmap between the first position in the sparsity bitmap and a third position in the sparsity bitmap, the first position corresponding to a value of the select signal, the third position corresponding to a least significant bit of the sparsity bitmap; and
    set the first value of the sparse select signal equal to the sum minus one.

10. The non-transitory computer readable storage medium of claim 8, wherein the instructions, when executed, cause the at least one processor to cause a multiplexer to transmit data to the processing element based on the first value of the sparse select signal.

11. The non-transitory computer readable storage medium of claim 8, wherein the instructions, when executed, cause the at least one processor to set the second value of the write enable signal equal to a value of a bit at the second position in the sparsity bitmap, the second position corresponding to a value of the select signal.

12. The non-transitory computer readable storage medium of claim 8, wherein the instructions, when executed, cause the at least one processor to cause the processing element to process data from a multiplexer based on the second value of the write enable signal.

13. The non-transitory computer readable storage medium of claim 8, wherein the instructions, when executed, cause, via transmission of the write enable signal, the sparsity bitmap to be reconstructed at the processing element.

14. The non-transitory computer readable storage medium of claim 8, wherein the value indicative of compressed data indicates that data following the header includes the sparsity bitmap and a zero-value-compression data vector.

15. An apparatus comprising:
    means for monitoring to monitor a buffer for a header including a value indicative of compressed data;
    means for controlling data to, when the buffer includes compressed data, determine a first value of a sparse select signal based on (1) a select signal and (2) a first position in a sparsity bitmap, the first value of the sparse select signal corresponding to a processing element that is to process a portion of the compressed data; and
    means for controlling writing to, when the buffer includes compressed data, determine a second value of a write enable signal based on (1) the select signal and (2) a second position in the sparsity bitmap, the second value of the write enable signal corresponding to the processing element that is to process the portion of the compressed data.

16. The apparatus of claim 15, wherein the means for controlling data is to:
    sum values of bits in the sparsity bitmap between the first position in the sparsity bitmap and a third position in the sparsity bitmap, the first position corresponding to a value of the select signal, the third position corresponding to a least significant bit of the sparsity bitmap; and
    set the first value of the sparse select signal equal to the sum minus one.

17. The apparatus of claim 15, wherein the means for controlling data is to cause a multiplexer to transmit data to the processing element based on the first value of the sparse select signal.

18. The apparatus of claim 15, wherein the means for controlling writing is to set the second value of the write enable signal equal to a value of a bit at the second position in the sparsity bitmap, the second position corresponding to a value of the select signal.

19. The apparatus of claim 15, wherein the means for controlling writing is to cause the processing element to process data from a multiplexer based on the second value of the write enable signal.

20. The apparatus of claim 15, wherein the means for controlling writing cause, via transmission of the write enable signal, the sparsity bitmap to be reconstructed at the processing element.

21. The apparatus of claim 15, wherein the value indicative of compressed data indicates that data following the header includes the sparsity bitmap and a zero-value-compression data vector.

\* \* \* \* \*